(12) United States Patent
Lee et al.

(10) Patent No.: US 9,305,921 B2
(45) Date of Patent: Apr. 5, 2016

(54) SEMICONDUCTOR DEVICE

(71) Applicant: SAMSUNG ELECTRONICS CO., LTD., Suwon-si, Gyeonggi-do (KR)

(72) Inventors: Jung-Chan Lee, Gyeonggi-do (KR); Seung-Jae Lee, Gyeonggi-do (KR); Sang-Bom Kang, Seoul (KR); Dae-Young Kwak, Gyeonggi-do (KR); Myeong-Cheol Kim, Gyeonggi-do (KR); Yong-Ho Jeon, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/565,903

(22) Filed: Dec. 10, 2014

(65) Prior Publication Data

US 2015/0145056 A1    May 28, 2015

Related U.S. Application Data

(62) Division of application No. 13/751,570, filed on Jan. 28, 2013, now Pat. No. 8,916,936.

(30) Foreign Application Priority Data

Aug. 22, 2012 (KR) .................. 10-2012-0091811

(51) Int. Cl.
*H01L 31/058* (2006.01)
*H01L 27/088* (2006.01)
*H01L 21/764* (2006.01)
*H01L 27/11* (2006.01)
*H01L 27/12* (2006.01)

(52) U.S. Cl.
CPC ............ *H01L 27/088* (2013.01); *H01L 21/764* (2013.01); *H01L 27/0886* (2013.01); *H01L 27/1116* (2013.01); *H01L 27/1211* (2013.01)

(58) Field of Classification Search
CPC ................. H01L 21/28273; H01L 21/823418; H01L 29/66825; H01L 27/11521; H01L 27/11524; H01L 21/823425
USPC .......... 257/368–369, 374; 438/199, 230, 299, 438/305, 591–595
See application file for complete search history.

(56) References Cited

U.S. PATENT DOCUMENTS

| 5,770,507 | A | * | 6/1998 | Chen et al. ............... 438/305 |
|---|---|---|---|---|
| 5,915,182 | A | | 6/1999 | Wu |
| 6,093,612 | A | | 7/2000 | Suh |
| 6,180,988 | B1 | | 1/2001 | Wu |
| 6,238,987 | B1 | | 5/2001 | Lee |

(Continued)

FOREIGN PATENT DOCUMENTS

| KR | 100258200 | 6/2000 |
|---|---|---|
| KR | 20010011638 | 2/2001 |

*Primary Examiner* — Dung Le
(74) *Attorney, Agent, or Firm* — F. Chau & Associates, LLC

(57) ABSTRACT

A semiconductor device including: a first gate pattern disposed in a peripheral region of a substrate; a second gate pattern disposed in a cell region of the substrate; a first insulator formed on sidewalls of the first gate pattern; and a second insulator formed on sidewalls of the second gate pattern, wherein a dielectric constant of the first insulator is different from a dielectric constant of the second insulator, and wherein a height of the second insulator is greater than a height of the second gate pattern.

20 Claims, 20 Drawing Sheets

(56) References Cited

U.S. PATENT DOCUMENTS

| | | |
|---|---|---|
| 6,316,347 B1 | 11/2001 | Chang et al. |
| 6,635,967 B2 | 10/2003 | Chang et al. |
| 6,780,753 B2 | 8/2004 | Latchford et al. |
| 6,921,711 B2 | 7/2005 | Cabral, Jr. et al. |
| 7,071,532 B2 | 7/2006 | Geffken et al. |
| 7,358,148 B2 | 4/2008 | Geffken et al. |
| 7,585,716 B2 | 9/2009 | Cheng |
| 7,683,441 B2 | 3/2010 | Shin |
| 7,691,712 B2 | 4/2010 | Chidambarrao et al. |
| 7,741,663 B2 | 6/2010 | Hause et al. |
| 7,838,373 B2 | 11/2010 | Giles et al. |
| 7,902,082 B2 | 3/2011 | Park et al. |
| 7,994,040 B2 | 8/2011 | Chi et al. |
| 8,471,343 B2 | 6/2013 | Doris et al. |
| 2008/0272438 A1 | 11/2008 | Doris et al. |
| 2010/0001349 A1* | 1/2010 | Kim et al. ............... 257/368 |
| 2012/0181617 A1 | 7/2012 | Luo et al. |

* cited by examiner

SEMICONDUCTOR DEVICE

CROSS-REFERENCE TO RELATED APPLICATIONS

This application is a Divisional of U.S. patent application Ser. No. 13/751,570 filed on Jan. 28, 2013 which claims priority under 35 U.S.C. §119 to Korean Patent Application No. 10-2012-0091811 filed in the Korean Intellectual Property Office on Aug. 22, 2012, the disclosures of which are incorporated by reference herein in their entireties.

BACKGROUND

1. Technical Field

The present inventive concept relates to a semiconductor device and a method for fabricating the same.

2. Discussion of the Related Art

Advances in electronic technology have led to a down-scaling of semiconductor devices. Since many semiconductor devices now require a high operating speed and accuracy, various transistor structures for these devices are being developed.

SUMMARY

An exemplary embodiment of the present inventive concept provides a semiconductor device, which can reduce a capacitive coupling phenomenon between a gate and a source and/or drain.

An exemplary embodiment of the present inventive concept provides a method for fabricating a semiconductor device, which can reduce a capacitive coupling phenomenon between a gate and a source and/or drain.

According to an exemplary embodiment of the present inventive concept, there is provided a semiconductor device including: a first gate pattern disposed in a peripheral region of a substrate; a second gate pattern disposed in a cell region of the substrate; a first insulator formed on sidewalls of the first gate pattern; and a second insulator formed on sidewalls of the second gate pattern, wherein a dielectric constant of the first insulator is different from a dielectric constant of the second insulator, and wherein a height of the second insulator is greater than a height of the second gate pattern.

The first gate pattern includes a first high-k gate insulation film, the first high-k gate insulation film being formed on the sidewalls and a bottom surface of the first gate pattern, and the second gate pattern includes a second high-k gate insulation film, the second high-k gate insulation film being formed on the sidewalls and a bottom surface of the second gate pattern.

The first insulator includes an air gap.

The dielectric constant of the first insulator is less than the dielectric constant of the second insulator.

The semiconductor device further includes an interlayer dielectric film disposed on the second gate pattern and between the second insulator.

According to an exemplary embodiment of the present inventive concept, there is provided a semiconductor device including: a first gate pattern disposed in a peripheral region of a substrate; a second gate pattern disposed in a cell region of the substrate; a first insulator formed on sidewalls of the first gate pattern; and a second insulator formed on sidewalls of the second gate pattern, wherein the first insulator includes an upper portion having a first dielectric constant and a lower portion having a second dielectric constant, wherein the first and second dielectric constants are different from each other, and wherein the second insulator has a third dielectric constant different from the first dielectric constant.

The upper portion of the first insulator includes an air gap.

The first gate pattern includes a high-k gate insulation film, the high-k gate insulation film being formed on the sidewalls and a bottom surface of the first gate pattern, wherein a thickness of the lower portion of the first insulator is less than a thickness of the high-k insulation film formed on the bottom surface of the first gate pattern.

According to an exemplary embodiment of the present inventive concept, there is provided a semiconductor device including: a first gate pattern disposed in a peripheral region of a substrate; a second gate pattern disposed in a cell region of a substrate; an air gap formed on sidewalls of the first gate pattern; and an insulator formed on sidewalls of the second gate pattern, wherein a dielectric constant of the air gap is different from a dielectric constant of the insulator.

The first gate pattern includes a first high-k gate insulation film, the first high-k gate insulation film being formed on the sidewalls and a bottom surface of the first gate pattern, and the second gate pattern includes a second high-k gate insulation film, the second high-k gate insulation film being formed on the sidewalls and a bottom surface of the second gate pattern.

The air gap is surrounded by a liner.

The liner includes a low-k material.

The semiconductor device further includes a contact electrically connected to a source/drain in the peripheral region, wherein a top surface of the contact is higher than a top surface of the first gate pattern, and wherein the source/drain is adjacent to the first gate pattern.

Sidewalls of the contact are stepped so that a width of a lower portion of the contact is less than a width of an upper portion of the contact.

The dielectric constant of the air gap is less than the dielectric constant of the insulator.

The air gap is exclusively formed in the peripheral region.

The cell region is static random access memory.

According to an exemplary embodiment of the present inventive concept, there is provided a semiconductor device including: a first gate electrode disposed between a source and a drain in a peripheral region of a substrate; a second gate electrode disposed in a cell region of the substrate; an air gap formed on sidewalls of the first gate electrode, sidewalls of the source and sidewalls of the drain; and an insulator formed on sidewalls of the second gate electrode.

The first gate electrode includes a first high-k gate insulation film, the first high-k gate insulation film being formed on the sidewalls and a bottom surface of the first gate electrode, and the second gate electrode includes a second high-k gate insulation film, the second high-k gate insulation film being formed on the sidewalls and a bottom surface of the second gate electrode.

The source and drain are formed in a trench in the substrate.

According to an exemplary embodiment of the present inventive concept, there is provided a method of forming a semiconductor device including: forming a first spacer on sidewalls of a first dummy gate pattern in a peripheral region of a substrate and forming a second spacer on sidewalls of a second dummy gate pattern in a cell region of the substrate; forming a first source/drain in a first trench adjacent to the first dummy gate pattern in the peripheral region and forming a second source/drain in a second trench adjacent to the second dummy gate pattern in the cell region; forming a first gate pattern in place of the first dummy gate pattern and forming a second gate pattern in place of the second dummy gate pattern; removing the first spacer to form an insulator; forming an interlayer dielectric film covering the first source/drain;

and forming a contact, after forming the first spacer, wherein the contact is electrically connected to the first source/drain through the interlayer dielectric film, wherein a dielectric constant of the insulator is different from a dielectric constant of the second spacer.

The insulator includes an air gap.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION OF THE EMBODIMENTS

Hereinafter, exemplary embodiments of the present inventive concept will be described in detail with reference to the accompanying drawings. This inventive concept may, however, be embodied in different forms and should not be construed as limited to the embodiments set forth herein. The same reference numbers may indicate the same elements, for example, a layer, film, region or substrate, throughout the specification and drawings. In the attached drawings, the thickness of elements may be exaggerated for clarity.

It will be understood that when an element is referred to as being "connected to," or "coupled to" another element, it can be directly connected to or coupled to another element or intervening elements may be present.

It will also be understood that when an element is referred to as being "on" another element, it can be directly on the other element, or intervening elements may also be present.

As used herein, the singular forms "a," "an" and "the" are intended to include the plural forms as well, unless the context clearly indicates otherwise.

Hereinafter, a semiconductor device according to exemplary embodiments of the present inventive concept will be described with reference to FIGS. 1 to 3.

Figure 1:
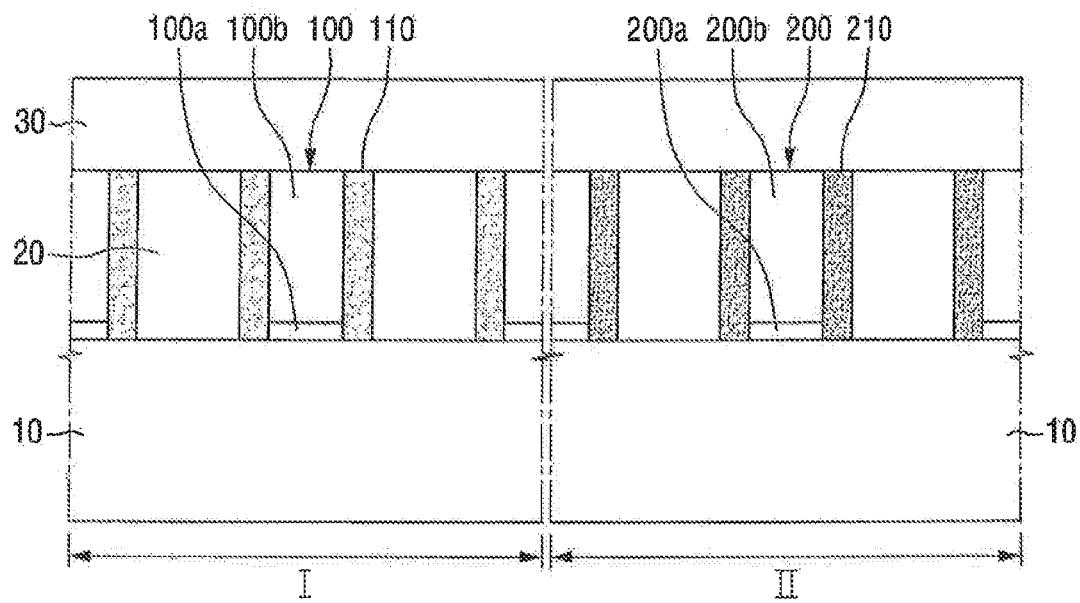
FIG. 1 is a cross-sectional view of a semiconductor device according to an exemplary embodiment of the present inventive concept.
Figure 2:
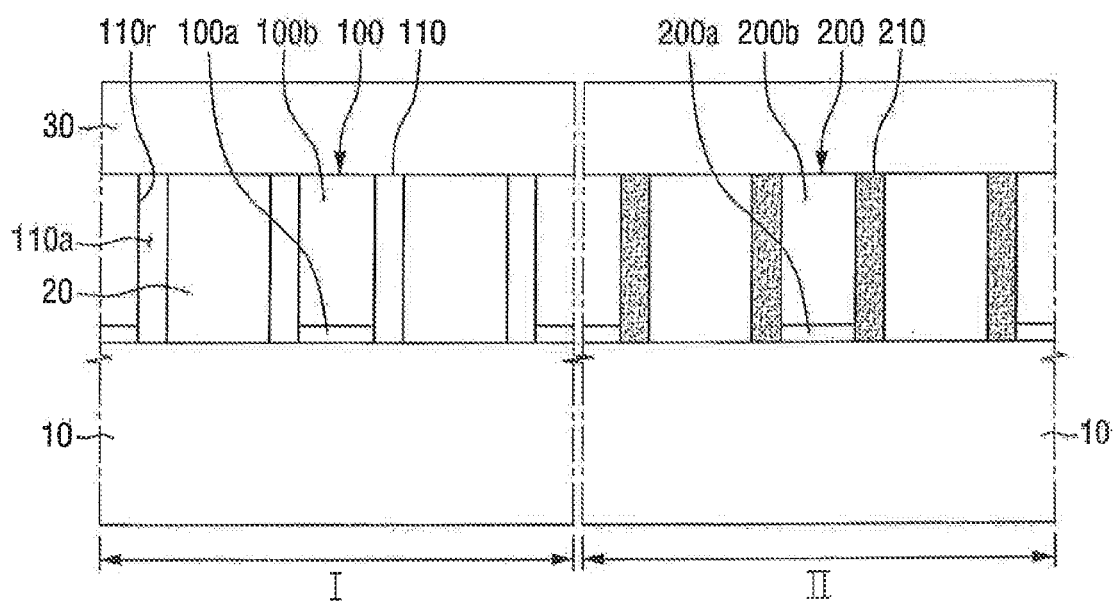
FIGS. 2 and 3 are cross-sectional views illustrating exemplary embodiments of the semiconductor device shown in FIG. 1.
Figure 3:
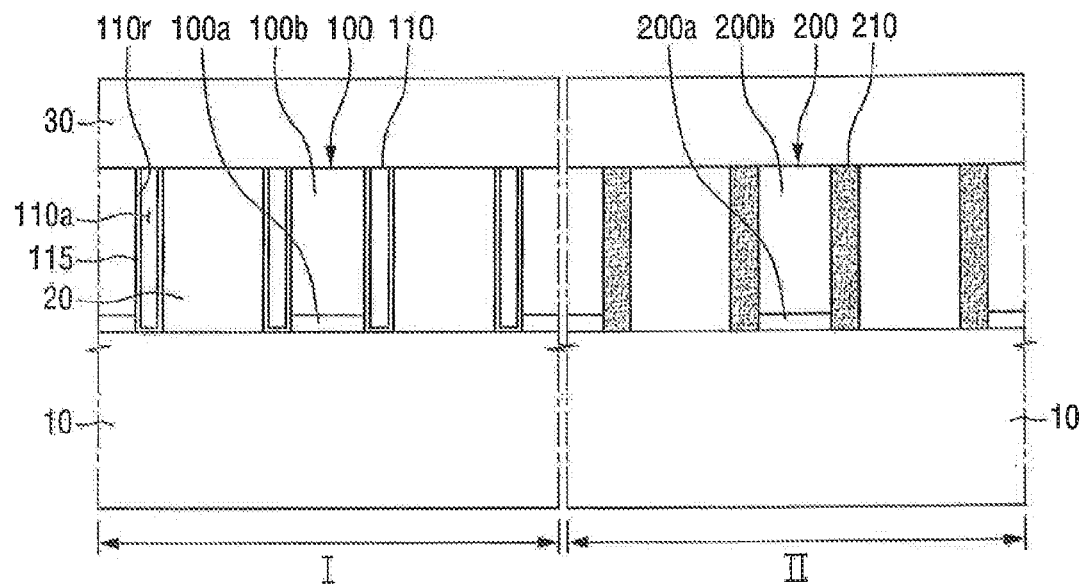

FIG. 1 is a cross-sectional view of a semiconductor device according to an exemplary embodiment of the present inventive concept, and FIGS. 2 and 3 are cross-sectional views illustrating exemplary embodiments of the semiconductor device shown in FIG. 1.

Referring to FIG. 1, the semiconductor device according to an exemplary embodiment of the present inventive concept includes a substrate 10, a first gate pattern 100, a second gate pattern 200, a first insulation layer 110 and a second insulation layer 210. The semiconductor device may further include a first interlayer dielectric film 20 surrounding the first and second gate patterns 100 and 200 and a second interlayer dielectric film 30 formed on the first and second gate patterns 100 and 200.

For example, a first region I and a second region II different from each other may be defined on the substrate 10. The first gate pattern 100 may be formed on the first region I and the second gate pattern 200 may be formed on the second region II. The first insulation layer 110 may be formed on sidewalls of the first gate pattern 100 and may have the same height as the first gate pattern 100. For example, the first insulation layer 110 may be made of an insulating material having a first dielectric constant. The second insulation layer 210 may be formed on sidewalls of the second gate pattern 200 and may have the same height as the second gate pattern 200. For example, the second insulation layer 210 may be made of an insulating material having a second dielectric constant different from the first dielectric constant.

The first region I may be, for example, a peripheral circuit region including peripheral circuits for driving a semiconductor device. The second region II may be, for example, a region including a cell array, for example, static random access memory (SRAM).

Top surfaces of the first gate pattern 100 and the first insulation layer 110 may be on the same plane. The top surface of the first interlayer dielectric film 20 may be coplanar with that of the first gate pattern 100. Likewise, the top surface of the second gate pattern 200 may be coplanar with that of the first interlayer dielectric film 20. In addition, the top surfaces of the second insulation layer 210 and the first interlayer dielectric film 20 may be on the same plane.

The substrate 10 may be bulk silicon or a silicon-on-insulator (SOI). In addition, the substrate 10 may be a silicon substrate or may include silicon germanium, indium antimonide, lead telluride, indium arsenide, indium phosphide, gallium arsenide or gallium antimonide, but the substrate 10 is not limited thereto.

The first gate pattern 100 may include a first gate insulation film 100a and a first gate electrode 100b sequentially stacked on the substrate 10. The second gate pattern 200 may include a second gate insulation film 200a and a second gate electrode 200b sequentially stacked on the substrate 10. The first gate insulation film 100a and the second gate insulation film 200a may include, for example, SiO, SiON, GexOyNz, GexSiyOz, a high dielectric constant material, and combinations thereof. The first gate electrode 100b and the second gate electrode 200b may include poly-Si, poly-SiGe, doped poly-Si, doped poly-SiGe or metals. When the first gate insulation film 100a and the second gate insulation film 200a include high-k gate insulation films, a barrier film (not shown) may further be formed between the first gate insulation film 100a and the first gate electrode 100b and between the second gate insulation film 200a and the second gate electrode 200b to protect the high-k gate insulation films. The barrier film may include, for example, at least one selected from the group consisting of titanium nitride (TiN), tantalum nitride (TaN) and a combination thereof.

The first insulation layer 110 and the second insulation layer 210 may include, for example, a silicon oxide film, a silicon nitride film, and a combination thereof. In the first insulation layer 110 and the second insulation layer 210 having different dielectric constants, the dielectric constant of the first insulation layer 110 may be smaller than that of the second insulation layer 210. For example, in the semiconductor device according to the current embodiment of the present inventive concept, the first insulation layer 110 may be an oxide film, a low-k oxide film or a low-k nitride film, and the second insulation layer 210 may be a nitride film. For example, the dielectric constant of the low-k oxide film or the low-k nitride film may be in a range of 2 to 6. For example, the first insulation layer 110 may include, $SiO_2$, SiOCH, SiOF, SiCN, SiOCN and combinations thereof. For example, $SiO_2$ may have a dielectric constant of 3.9, SiN may have a dielectric constant of 6.2 to 7.0, low-k materials such as SiOCN, SiCN, SiBN and SiBCN may have a dielectric constant of 4.0 to 6.0 and air may have a dielectric constant of 1.0.

The term "dielectric constant" used herein may mean an average dielectric constant of an insulation layer. Therefore, when an insulation layer includes multiple materials, the dielectric constant of the insulation layer including multiple materials means the average dielectric constant of the insulation layer including multiple materials.

The first interlayer dielectric film 20 and the second interlayer dielectric film 30 may include, for example, silicon oxide (SiO) or a low-k material, or may be doped with an impurity. The low-k material may include, for example, FOX (Flowable Oxide), TOSZ (Tonen SilaZen), USG (Undoped Silica Glass), BSG (Borosilica Glass), PSG (PhosphoSilaca Glass), BPSG (BoroPhosphoSilica Glass), PRTEOS (Plasma Enhanced Tetra Ethyl Ortho Silicate), FSG (Fluoride Silicate Glass), HDP (High Density Plasma), PEOX (Plasma Enhanced Oxide), and combinations thereof.

Exemplary embodiments of the semiconductor device according to the current embodiment of the present inventive concept will be described with reference to FIGS. 2 and 3. The semiconductor device shown in FIG. 2 may be substantially the same as the semiconductor device shown in FIG. 1, except that it includes a first insulation layer having an air gap. In addition, the semiconductor device shown in FIG. 3 may be substantially the same as the semiconductor device shown in FIG. 1, except that it includes a first insulation layer having a liner.

Referring to FIG. 2, the first insulation layer 110 may have a first air gap 110a. The first air gap 110a may be a space enclosed by a first recess 110r and a second interlayer dielectric film 30. The first air gap 110a may come into contact with a first gate pattern 100, a first interlayer dielectric film 20 and the second interlayer dielectric film 30. FIG. 2 illustrates that a bottom surface of the first recess 110r having the first air gap 110a is a substrate 10, but exemplary embodiments of the present inventive concept are not limited thereto. In other words, in the course of forming the first recess 110r, some of a material used to fill the first recess 110r before the first recess 110r is formed may remain on the substrate 10.

In the exemplary embodiment of the present inventive concept shown in FIG. 2 or 3, the dielectric constant of the second insulation layer 210 may be greater than that of the first insulation layer 110 having the first air gap 110a. Since the dielectric constant of the first air gap 110a may be a very small value, the second insulation layer 210 may include various materials. For example, the second insulation layer 210 may include at least one of a silicon oxide film, a low-k oxide film, and a nitride film.

In the following description of FIG. 3, it is assumed that the first insulation layer 110 has a first air gap 110a.

Referring to FIG. 3, the first insulation layer 110 may further include a liner 115. The first air gap 110a may be formed in the first recess 110r having the liner 115. For example, the first insulation layer 110 may have the liner 115 and the first air gap 110a positioned within the liner 115. The dielectric constant of the first insulation layer 110 may be an average value of dielectric constants of the liner 115 and the first air gap 110a.

The liner 115 may be conformally formed along the first recess 110r. The liner 115 may be formed using a material having good step coverage and a manufacturing method thereof. In addition, to reduce the dielectric constant of the first insulation layer 110, the liner 115 may be formed using a material having a low dielectric constant. The liner 115 may be, for example, an oxide film or a nitride film. For example, the liner 115 may include low-k SiOCN, low-k SiBN, SiN and combinations thereof.

A semiconductor device according to an exemplary embodiment of the present inventive concept will be described with reference to FIG. 4.

Figure 4:
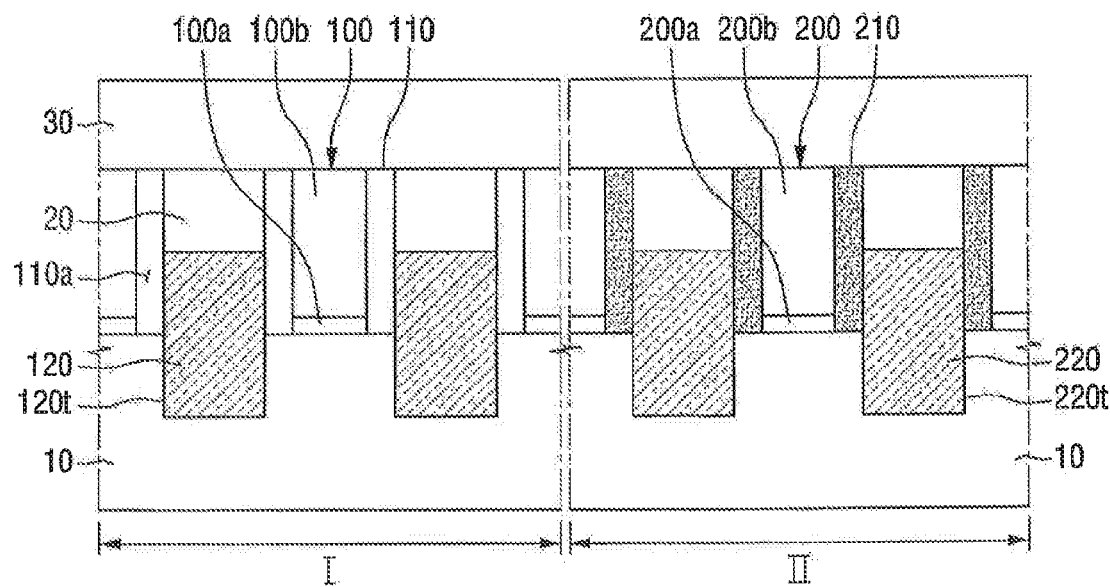
FIG. 4 is a cross-sectional view of a semiconductor device according to an exemplary embodiment of the present inventive concept.

FIG. 4 is a cross-sectional view of a semiconductor device according to an exemplary embodiment of the present inventive concept.

Referring to FIG. 4, the semiconductor device according to the current embodiment of the present inventive concept may include a first source/drain 120 formed at both sides of a first gate pattern 100. In addition, the semiconductor device according to the current embodiment of the present inventive concept may include a second source/drain 220 formed at both sides of a second gate pattern 200. The first source/drain 120 and the second source/drain 220 may be elevated from the substrate 10. In the elevated first source/drain 120 side, the first air gap 110a may be surrounded by the substrate 10, the first gate pattern 100, the first source/drain 120, the first interlayer dielectric film 20 and the second interlayer dielectric film 30. FIG. 4 illustrates that top surfaces of the elevated first source/drain 120 and the elevated second source/drain 220 are lower than top surfaces of the first and second gate patterns 100 and 200, but exemplary embodiments of the present inventive concept are not limited thereto.

The top surfaces of the first source/drain 120 and the second source/drain 220 elevated from the substrate 10 may be lower than the top surfaces of the first gate pattern 100 and the second gate pattern 200, respectively.

The first source/drain 120 and the second source/drain 220 may be formed in a first trench 120t and a second trench 220t recessed into the substrate 10. The first source/drain 120 and the second source/drain 220 formed in the first trench 120t and the second trench 220t may maximize tensile or compressive stress applied to channel regions under the first gate pattern 100 and the second gate pattern 200, respectively. To maximize the tensile or compressive stress applied to channel regions, the first trench 120t and the second trench 220t may have various shapes. FIG. 4 illustrates that sections of the first and second trenches 120t and 220t are box-shaped, but sections of the first and second trenches 120t and 220t are not limited thereto. For example, the sections of the first and second trenches 120t and 220t may be sigma (Σ) shaped.

The elevated first source/drain 120 and the elevated second source/drain 220 may be, for example, epitaxially grown single crystalline semiconductor patterns. When a semiconductor device is a p-type MOS (PMOS) transistor, since the semiconductor device operates by holes, a compressive stress is applied to the substrate 10. The semiconductor patterns of the elevated first source/drain 120 and the elevated second source/drain 220 may be made of a material having a greater lattice constant than the substrate 10. For example, when the substrate 10 is made of silicon (Si), the elevated first source/drain 120 and the elevated second source/drain 220 may be made of silicon germanium (SiGe) having a greater lattice constant than silicon (Si). When the semiconductor device is an n-type MOS (NMOS) transistor, since the semiconductor device operates by electrons, a tensile stress is applied to the substrate 10. The semiconductor patterns of the elevated first source/drain 120 and the elevated second source/drain 220 may be made of a material having a smaller lattice constant than the substrate 10. For example, when the substrate 10 is made of silicon (Si), the elevated first source/drain 120 and the elevated second source/drain 220 may be made of silicon carbide (SiC) having a smaller lattice constant than silicon (Si). However, when the semiconductor device is an n-type MOS (NMOS) transistor, a source/drain formed in a trench may be an elevated silicon epitaxial film.

In the light of the foregoing, an elevated source/drain can be formed when transistors formed in the first region I and the second region II are a pMOS transistor and an nMOS transistor, respectively. In addition, even if transistors formed in the first region I and the second region II are of the same type, the first source/drain 120 and the second source/drain 220 respectively formed in the first and second regions I and II may be different from each other.

A semiconductor device according to an exemplary embodiment of the present inventive concept will be described with reference to FIG. 5.

Figure 5:
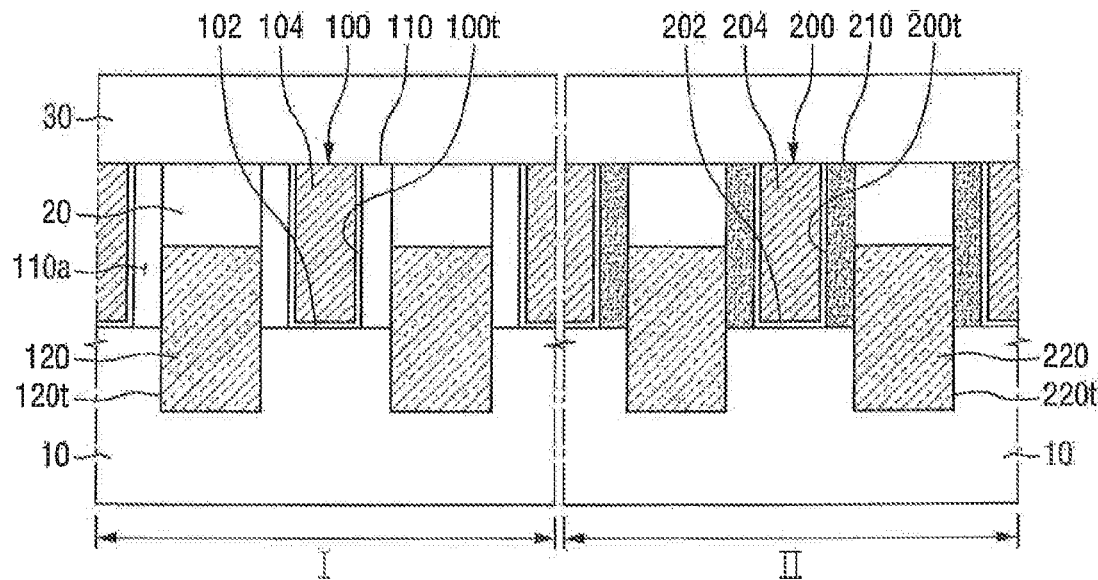
FIG. 5 is a cross-sectional view of a semiconductor device according to an exemplary embodiment of the present inventive concept.

FIG. 5 is a cross-sectional view of a semiconductor device according to an exemplary embodiment of the present inventive concept.

Referring to FIG. 5, a first gate pattern 100 may include a first high-k gate insulation film 102 and a first metal gate electrode 104. A second gate pattern 200 may include a second high-k gate insulation film 202 and a second metal gate electrode 204. The first gate pattern 100 and the second gate pattern 200 may be formed in a third trench 100t and a fourth trench 200t formed on the first region I and the second region II, respectively. The third trench 100t and the fourth trench 200t may be formed in a first interlayer dielectric film 20. The first and second high-k gate insulation films 102 and 202 may conformally cover the third trench 100t and the fourth trench 200t, respectively. In other words, the first high-k gate insulation film 102 may be formed on sidewalls and a bottom surface of the third trench 100t with a uniform thickness. For example, the first high-k gate insulation film 102 may be formed to have a cup-shaped section. The first metal gate electrode 104 and the second metal gate electrode 204 may be formed on the first and second high-k gate insulation films 102 and 202, respectively.

The first gate pattern 100 and the second gate pattern 200 may be surrounded and exposed by the first interlayer dielectric film 20. In the first interlayer dielectric film 20, the third trench 100t may have the first insulation layer 110 as its sidewall, and the fourth trench 200t may have the second insulation layer 210 as its sidewall. The first high-k gate insulation film 102 and the second high-k gate insulation film 202 may come into contact with the first insulation layer 110 and the second insulation layer 210, respectively. Since the first insulation layer 110 may include a first air gap 110a, the first high-k gate insulation film 102 may come into contact with the first air gap 110a. However, if the first insulation layer 110 further includes a liner (e.g., 115 of FIG. 3), the first high-k gate insulation film 102 may come into contact with the liner 115.

Lateral surfaces of the first metal gate electrode 104 and the second metal gate electrode 204 may be surrounded by the first and second high-k gate insulation films 102 and 202 having a cup-shaped section.

The first high-k gate insulation film 102 and the second high-k gate insulation film 202 may include, for example, at least one selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but they are not limited thereto. The first and second high-k gate insulation films 102 and 202 may further include a chemical gate oxide film (not shown) formed between each of the first and second high-k gate insulation films 102 and 202 and the substrate 10.

In the illustrated embodiment of FIG. 5, the first metal gate electrode 104 and the second metal gate electrode 204 are single layers, but exemplary embodiments of the present inventive concept are not limited thereto. Each of the first metal gate electrode 104 and the second metal gate electrode 204 may be formed of a single layer or multiple layers including, for example, hafnium (Hf), a zirconium (Zr), titanium (Ti), tantalum (Ta), aluminum (Al) and alloys thereof. For example, the first and second metal gate electrodes 104 and 204 may have, for example, a five-layered structure of TiN—TaN—TiAl—TiN—Ti/Al.

A semiconductor device according to an exemplary embodiment of the present inventive concept will be described with reference to FIGS. 6 to 8.

Figure 6:
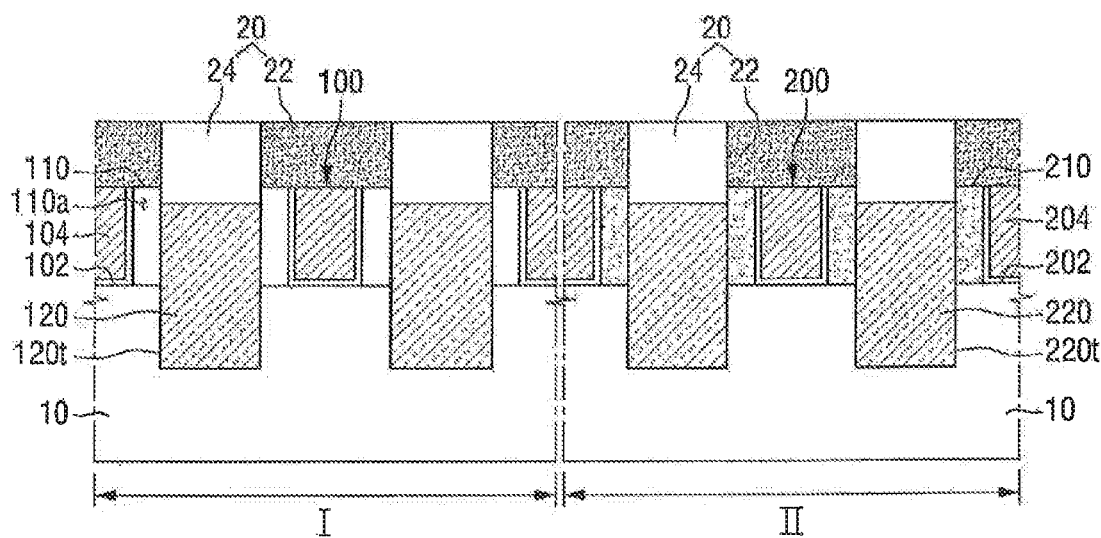
FIG. 6 is a cross-sectional view of a semiconductor device according to an exemplary embodiment of the present inventive concept.

FIG. 6 is a cross-sectional view of a semiconductor device according to an exemplary embodiment of the present inventive concept. FIG. 7 is a cross-sectional view illustrating an exemplary embodiment of the semiconductor device shown in FIG. 6, and FIG. 8 illustrates application examples of gate patterns and insulation layers shown in FIG. 6.

Figure 8:
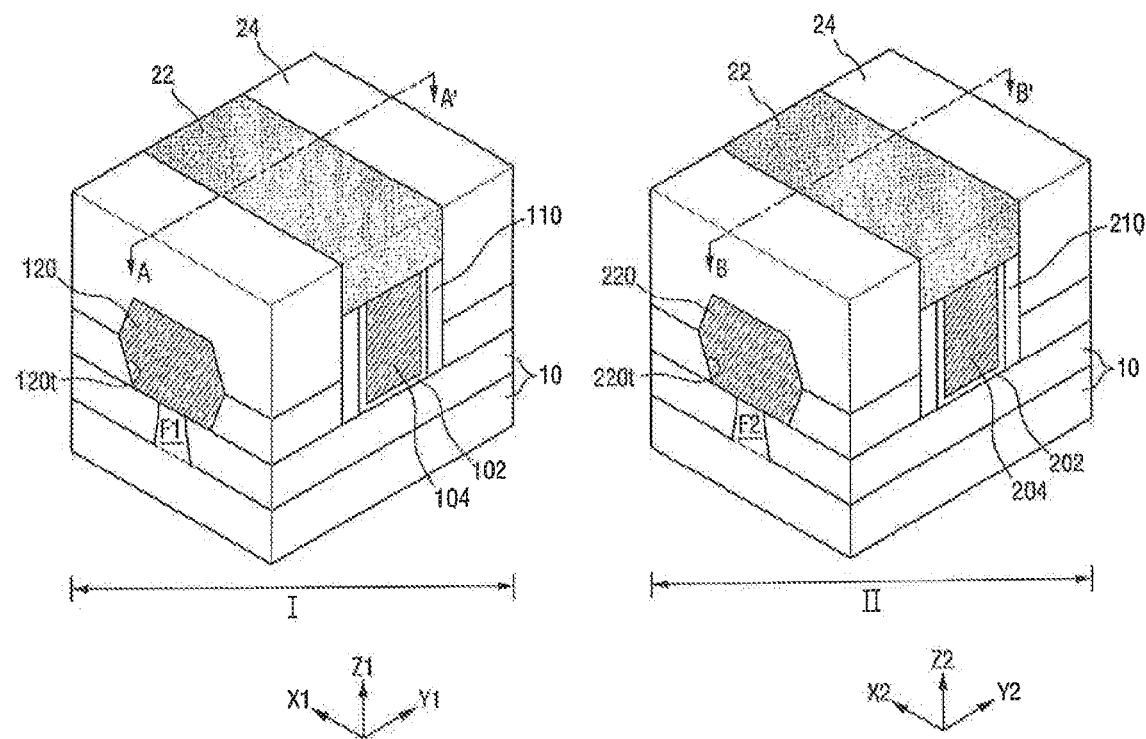
FIG. 8 illustrates application examples of gate patterns and insulation layers shown in FIG. 6.

FIG. 8, gate patterns having different insulation layers, as shown in FIG. 6, are applied to fin-type transistors FinFETs (Fin Field Effect Transistors). A section of FIG. 8 taken along direction AA' may be a first region I shown in FIG. 6, and a section of FIG. 8 taken along direction BB' may be a second region II shown in FIG. 6.

Referring to FIG. 6, a first interlayer dielectric film 20 may include a first interlayer dielectric film pattern 22 and a second interlayer dielectric film pattern 24 formed on the same level. The first interlayer dielectric film pattern 22 may be formed directly on a first gate pattern 100 and a second gate pattern 200, respectively. The second interlayer dielectric film pattern 24 may be formed directly on a first source/drain 120 and a second source/drain 220, respectively. The term "same level" used herein may mean that top surfaces of the first interlayer dielectric film pattern 22 and the second interlayer dielectric film pattern 24 are coplanar.

The first interlayer dielectric film pattern 22 and the second interlayer dielectric film pattern 24 may include, for example, different materials. For example, the first interlayer dielectric film pattern 22 and the second interlayer dielectric film pattern 24 may include materials having high etching selectivity. This is for the purpose of allowing a contact formed on the first gate pattern 100 and the second gate pattern 200 and a contact formed on the first source/drain 120 and the second source/drain 220 to be self-aligned. The first interlayer dielectric film pattern 22 may include, for example, nitride. The second interlayer dielectric film pattern 24 may include, for example, a silicon oxide or a low dielectric constant material or may be doped with an impurity.

The first interlayer dielectric film pattern 22 may be formed to contact the first gate pattern 100 and the second gate pattern 200. The first interlayer dielectric film pattern 22 may also be formed directly on the first insulation layer 110 and the second insulation layer 210. In other words, the first interlayer dielectric film pattern 22 formed directly on the first gate pattern 100 may extend to the first insulation layer 110. The first interlayer dielectric film pattern 22 formed directly on the second gate pattern 200 may extend to the second insulation layer 210. The first interlayer dielectric film pattern 22 may be formed by filling spaces between the second interlayer dielectric film pattern 24 and the first gate pattern 100 and between the second interlayer dielectric film pattern 24 and the second gate pattern 200. For this, the first interlayer dielectric film pattern 22 may include voids formed therein. In FIG. 6, the second interlayer dielectric film pattern 24 and the first interlayer dielectric film pattern 22 have different thicknesses, but exemplary embodiments of the present inventive concept are not limited thereto.

The first interlayer dielectric film pattern 22 extending directly above the second insulation layer 210 may include a different material from the second insulation layer 210. A dielectric constant of the second insulation layer 210 may be smaller than that of the first interlayer dielectric film pattern 22. For example, the first interlayer dielectric film pattern 22 may include a nitride film and the second insulation layer 210 may include an oxide film, a low dielectric constant oxide film or a low dielectric constant nitride film.

Figure 7:
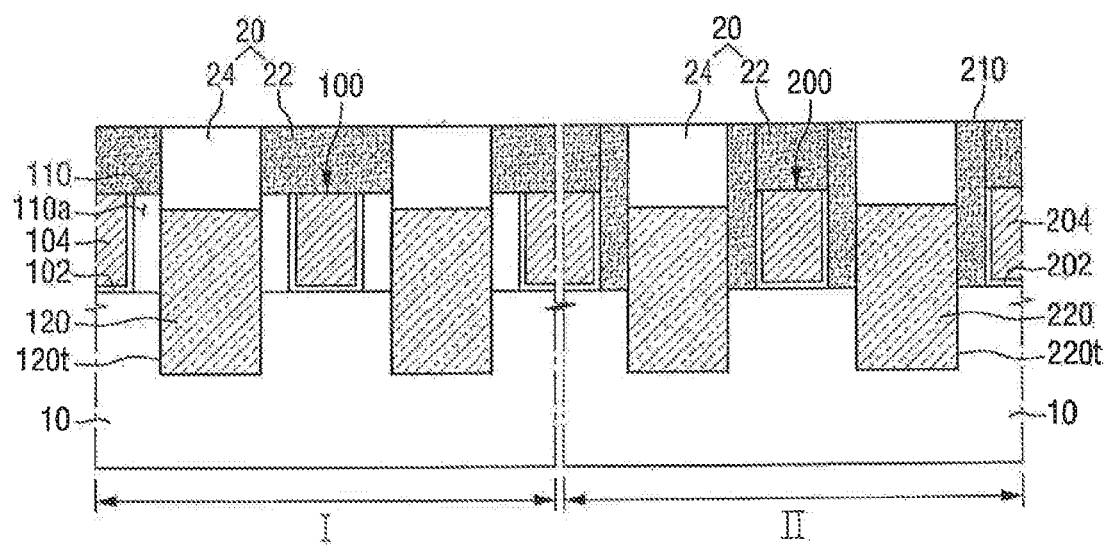
FIG. 7 is a cross-sectional view illustrating an exemplary embodiment of the semiconductor device shown in FIG. 6.

Referring to FIG. 7, the second insulation layer 210 may have a different height from the second gate pattern 200. In other words, a height of the second insulation layer 210 may be greater than that of the second gate pattern 200. However, the first insulation layer 110 and the first gate pattern 100 may have substantially the same height. The first interlayer dielectric film pattern 22 may extend directly above the first insulation layer 110. However, the first interlayer dielectric film pattern 22 is formed directly on the second gate pattern 200 but not on the second insulation layer 210. The second insulation layer 210 may include, for example, the same material as the first interlayer dielectric film pattern 22, for example a nitride film. The second gate pattern 200 may be surrounded by the second insulation layer 210 and the first interlayer dielectric film pattern 22. The reason that the second insulation layer 210 has a greater height than the second gate pattern 200 will be described later with reference to FIGS. 28 to 30.

Referring to FIG. 8, a first fin-type transistor may be formed on a first region I and a second fin-type transistor may be formed on a second region II. The first fin-type transistor may include a first fin F1 extending in direction y1, a first metal gate electrode 104, a first source/drain 120 formed in a first trench 120t and a first high-k gate insulation film 102. The first fin-type transistor may further include a first insulation layer 110 insulating the first metal gate electrode 104 from the first source/drain 120. In FIG. 6, a portion between the first source/drain 120 may correspond to the first fin F1. The first high-k gate insulation film 102 may be formed between the first fin F1 and the first metal gate electrode 104. The second fin-type transistor may include a second fin F2 extending in direction y2, a second metal gate electrode 204, a second source/drain 220 formed in a second trench 220t and a second high-k gate insulation film 202. The second fin-type transistor may further include a second insulation layer 210 insulating the second metal gate electrode 204 from the second source/drain 220. In FIG. 6, a portion between the second source/drain 220 may correspond to the second fin F2. The second high-k gate insulation film 202 may be formed between the second fin F2 and the second metal gate electrode 204.

A dielectric constant of the first insulation layer 110 may be different from a dielectric constant of the second insulation layer 210. For example, the dielectric constant of the first insulation layer 110 may be smaller than that of the second insulation layer 210. The first insulation layer 110 may include a first air gap 110a and may further include a liner (e.g., 115 of FIG. 3).

A semiconductor device according to an exemplary embodiment of the present inventive concept will be described with reference to FIG. 9.

Figure 9:
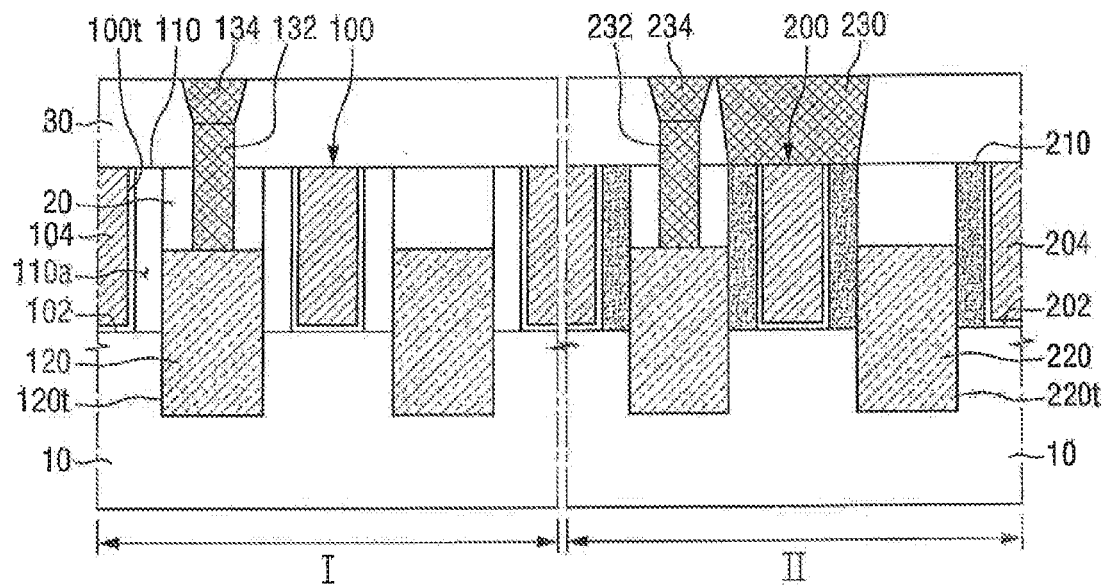
FIG. 9 is a cross-sectional view of a semiconductor device according to an exemplary embodiment of the present inventive concept.

FIG. 9 is a cross-sectional view of a semiconductor device according to an exemplary embodiment of the present inventive concept.

Referring to FIG. 9, the semiconductor device according to the current embodiment of the present inventive concept may further include a first contact 134 formed on a first region I and a second contact 230 and a third contact 234 formed on a second region II. The first contact 134 may be electrically connected to the first source/drain 120 or may be connected to the first source/drain 120 through a first via 132. The semiconductor device of the first region I may not include a contact connected to the first gate pattern 100. The second contact 230 may come into contact with the second gate pattern 200. The third contact 234 may be electrically connected to the second source/drain 220 or may be connected to the second source/drain 220 through a second via 232. The first via 132 and the second via 232 may not be provided according to the configuration of the semiconductor device.

The first contact 134, the second contact 230 and the third contact 234 may include, for example, tungsten, copper, aluminum and combinations thereof. The first via 132 and the second via 232 may include, for example, tungsten.

A contact may not be present on the first gate pattern 100 of the first region I. In other words, if a contact is formed on the first insulation layer 110, for example the first insulation layer 110 including a first air gap 110a, the reliability of the semiconductor device may deteriorate. For example, if a width of a gate pattern is reduced, a width of the contact connected to the gate pattern may also be reduced. However, the contact width may be greater than the gate pattern width due to a processing margin of photolithography. In this case, the contact may surround a portion of the sidewall of the gate pattern. In a case where an insulation layer (for example, a spacer) formed at both sides of the gate pattern includes an air gap, a portion of the contact may be electrically connected to a channel region along the gate pattern. When an electrical connection is established between the contact and the channel region, the reliability of the semiconductor device may be affected. However, if the first insulation layer 110 does not include the first air gap 110a but includes only a low-k oxide film, a contact may be positioned on the first gate pattern 100.

A semiconductor device according to an exemplary embodiment of the present inventive concept will be described with reference to FIGS. 10A and 10B. This embodiment illustrates the semiconductor device shown in FIG. 6 with a contact.

Figure 10A:
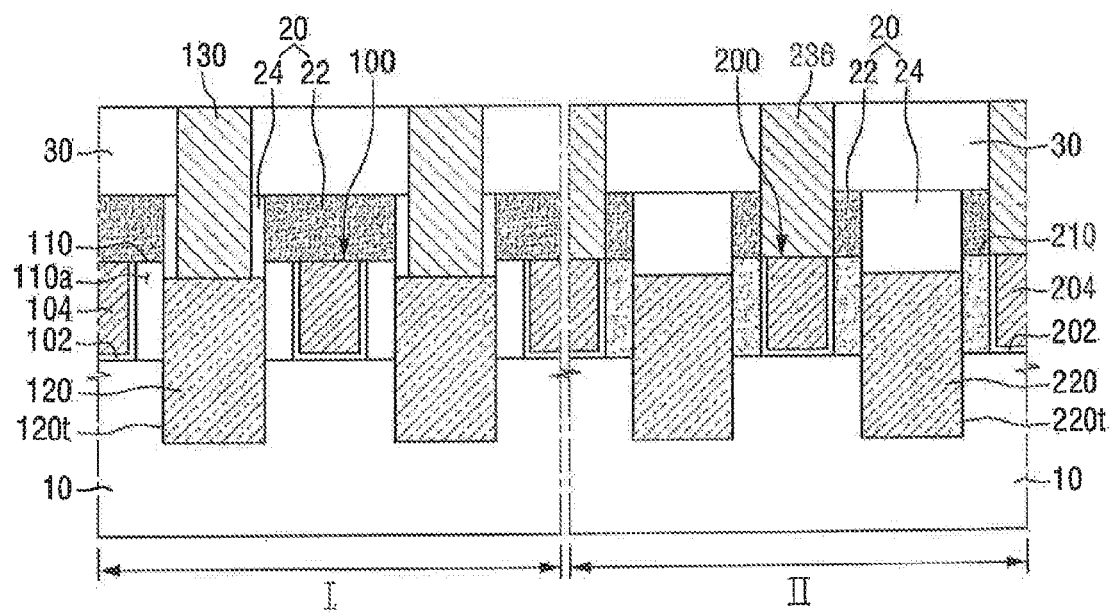
FIG. 10A is a cross-sectional view of a semiconductor device according to an exemplary embodiment of the present inventive concept and FIG. 10B is a cross-sectional view illustrating an exemplary embodiment of the semiconductor device shown in FIG. 10A.
Figure 10B:
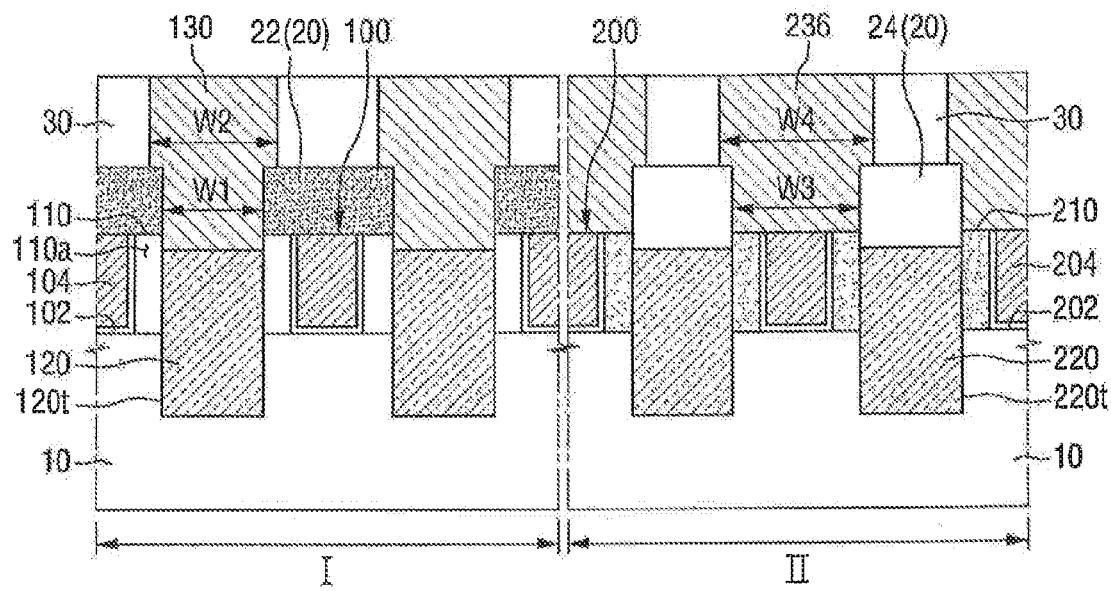

FIG. 10A is a cross-sectional view of a semiconductor device according to an exemplary embodiment of the present inventive concept and FIG. 10B is a cross-sectional view illustrating an exemplary embodiment of the semiconductor device shown in FIG. 10A.

Referring to FIG. 10A, the semiconductor device according to the current embodiment of the present inventive concept may include a fourth contact 130 formed on a first region I and a fifth contact 236 formed on a second region II. The semiconductor device may further include a second interlayer dielectric film 30 formed on a first interlayer dielectric film 20.

The fourth contact 130 may be electrically connected to a first source/drain 120. Unlike the first contact 134 shown in FIG. 9, the fourth contact 130 may be electrically connected to the first source/drain 120 without using a medium, such as a via. A lower portion of the fourth contact 130 may be surrounded by a second interlayer dielectric film pattern 24 and an upper portion thereof may be surrounded by the second interlayer dielectric film 30. At a portion of the fourth contact 130 contacting the first source/drain 120, a width of the fourth contact 130 may be smaller than a width of a top surface of the first source/drain 120.

The fifth contact 236 may be electrically connected to a second gate pattern 200. A lower portion of the fifth contact 236 may be surrounded by a first interlayer dielectric film pattern 22 and an upper portion thereof may be surrounded by a second interlayer dielectric film 30. In the illustrated embodiment, only the fifth contact 236 is formed directly on the second gate pattern 200 in the second region II, but exemplary embodiments of the present inventive concept are not limited thereto. In other words, another contact may be formed directly on the second source/drain 220. At a portion of the fifth contact 236 contacting the second gate pattern 200, a width of the fifth contact 236 may be smaller than a sum of widths of top surfaces of the second gate pattern 200 and the second insulation layer 210.

The fourth contact 130 and the fifth contact 236 may include, for example, tungsten, copper, aluminum and combinations thereof.

Referring to FIG. 10B, a lower portion of the fourth contact 130 may have a first width w1 and an upper portion thereof may have a second width w2. The width w1 of the lower portion of the fourth contact 130 may be smaller than the width w2 of the upper portion thereof. In the illustrated embodiment of the present inventive concept, both sidewalls of the fourth contact 130 are stepwise, but exemplary embodiments of the present inventive concept are not limited thereto. For example, one sidewall of the fourth contact 130 may be stepwise and the other sidewall of the fourth contact 130 may be linear with the same slope at its upper and lower portions.

The first width w1 may be substantially the same as a width of the first source/drain 120 formed under the fourth contact 130. The fourth contact 130 may overlap the first insulation layer 110. For example, the fourth contact 130 protruding on the first interlayer dielectric film pattern 22 may overlap the first insulation layer 110. The lower portion of the fourth contact 130 having the first width w1 may be surrounded by the first interlayer dielectric film pattern 22 and the first insulation layer 110. The upper portion of the fourth contact 130 having the second width w2 may be surrounded by the second interlayer dielectric film 30.

If the first insulation layer 110 (of FIGS. 10A and 10B) has the first air gap 110a, a liner surrounding the air gap may also be formed, thereby allowing the fourth contact 130 and the substrate 10 of the first region I to be electrically insulated from each other.

Referring to FIG. 10B, a lower portion of the fifth contact 236 may have a third width w3 and an upper portion thereof may have a fourth width w4. The width w3 of the lower portion of the fifth contact 236 may be smaller than the width w4 of the upper portion thereof.

A sum of widths of the second gate pattern 200 and the second insulation layer 210 may be substantially the same as the third width w3 of the fifth contact 236. The fifth contact 236 protruding on the second interlayer dielectric film pattern 24 may overlap the second source/drain 220. The lower portion of the fifth contact 236 having the third width w3 may be surrounded by the second interlayer dielectric film pattern 24.

A semiconductor device according to an exemplary embodiment of the present inventive concept will be described with reference to FIGS. 11A to 12.

Figure 11A:
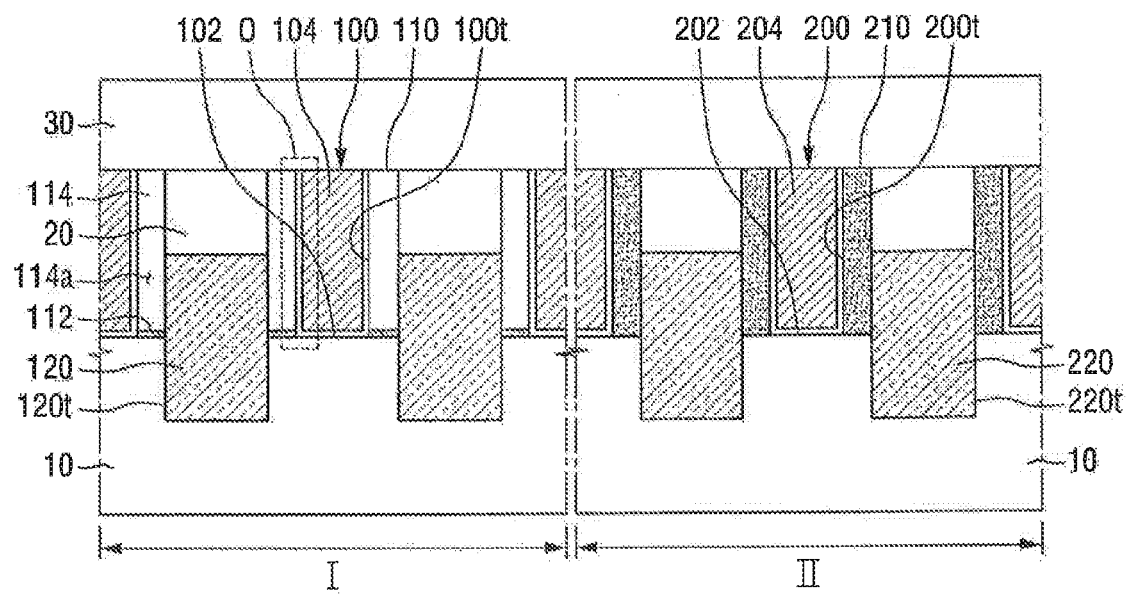
FIGS. 11A and 11B are cross-sectional views of a semiconductor device according to an exemplary embodiment of the present inventive concept.
Figure 11B:
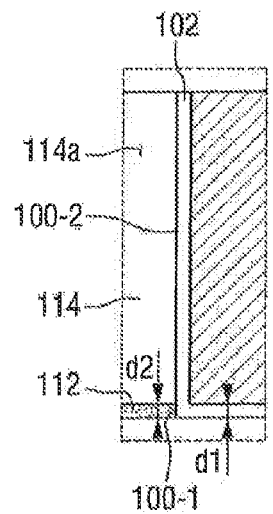
Figure 12:
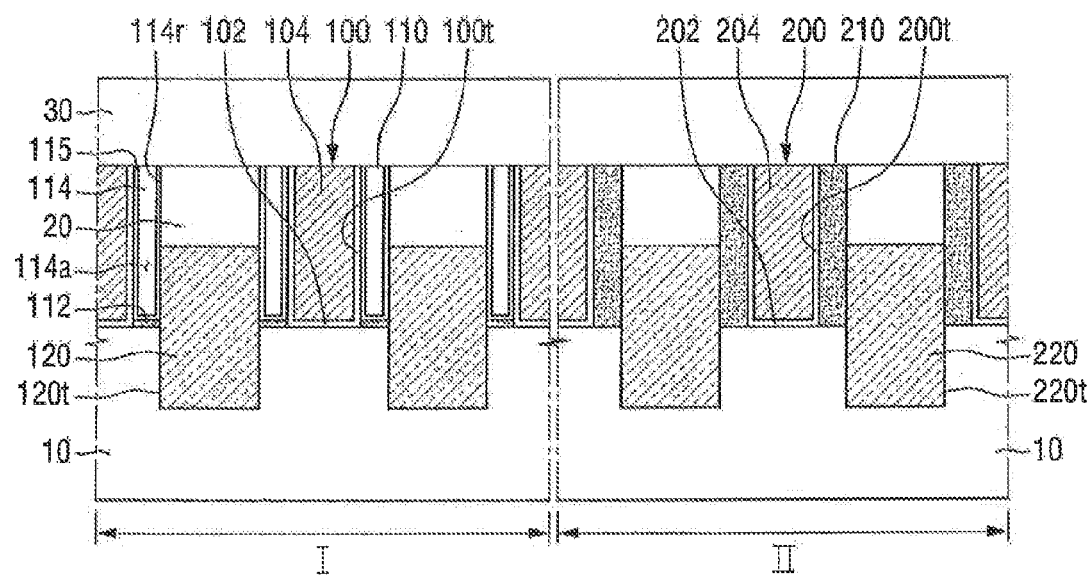
FIG. 12 is a cross-sectional view illustrating an exemplary embodiment of the semiconductor device shown in FIG. 11A.

FIGS. 11A and 11B are cross-sectional views of a semiconductor device according to an exemplary embodiment of the present inventive concept and FIG. 12 is a cross-sectional view illustrating an exemplary embodiment of the semiconductor device shown in FIG. 11A. FIG. 11B is an enlarged view of region 'O' in FIG. 11A. The semiconductor device according to the current embodiment of the present inventive concept is substantially the same as the semiconductor device shown in FIG. 5, except that a first insulation layer is divided into two regions.

Referring to FIGS. 11A and 11B, a first gate pattern 100 may include a first lower gate pattern 100-1 and a first upper gate pattern 100-2. A first insulation layer 110 formed on sidewalls of the first gate pattern 100 may include a first lower insulation layer 112 and a first upper insulation layer 114. The first lower insulation layer 112 may be formed to contact the first lower gate pattern 100-1. The first upper insulation layer 114 may be formed to contact the first upper gate pattern 100-2.

The first lower insulation layer 112 may be formed to protect a channel region under the substrate 10. In addition, the first lower insulation layer 112 may also be formed to adjust a dielectric constant of the first insulation layer 110. A boundary plane of the first lower insulation layer 112 and the first upper insulation layer 114 may be substantially level with the substrate 10, but exemplary embodiments of the present inventive concept are not limited thereto. In other words, a top surface of the first lower insulation layer 112 may be a curved surface or a surface including irregularities according to the manufacturing method of the first lower insulation layer 112.

A first high-k gate insulation film 102 may have a first thickness d1 and the first lower insulation layer 112 may have a second thickness d2. For example, the first thickness d1 of the first high-k gate insulation film 102 may be greater than the second thickness d2 of the first lower insulation layer 112, but exemplary embodiments of the present inventive concept are not limited thereto.

The first insulation layer 110 including the first upper insulation layer 114 and the first lower insulation layer 112 may have a first dielectric constant. A dielectric constant of the first insulation layer 110 may be different from a second dielectric constant that is a dielectric constant of the second insulation layer 210. The dielectric constant of the first insulation layer 110 may be smaller than that of the second insulation layer 210. In the following description of FIGS. 11A to 12, it is assumed that the first insulation layer 110 having a smaller dielectric constant is divided into an upper portion and a lower portion. However, the second insulation layer 210 having a greater dielectric constant may also be divided into an upper portion and a lower portion. Further, both of the first insulation layer 110 and the second insulation layer 210 may be divided into an upper portion and a lower portion.

The dielectric constant of the first lower insulation layer 112 may be greater than that of, for example, the first upper insulation layer 114. The first upper insulation layer 114 may include, for example, a second air gap 114a. In the current embodiment, the first lower insulation layer 112 may include at least one of a nitride film, an oxide film, a low-k oxide film and a low-k nitride film, and the first upper insulation layer 114 may include at least one of an oxide film, a low-k oxide film and a low-k nitride film.

Referring to FIG. 12, the first upper insulation layer 114 may further include a liner 115. A second air gap 114a may be formed in a first upper recess 114r having the liner 115. In other words, the first upper insulation layer 114 may include the liner 115 and the second air gap 114a formed in between the liner 115. The liner 115 may be conformally formed along the first upper recess 114r. To reduce the dielectric constant of the first insulation layer 110, the liner 115 may be made of a low dielectric constant material.

A semiconductor device according to an exemplary embodiment of the present inventive concept will be described with reference to FIGS. 13 and 14.

Figure 13:
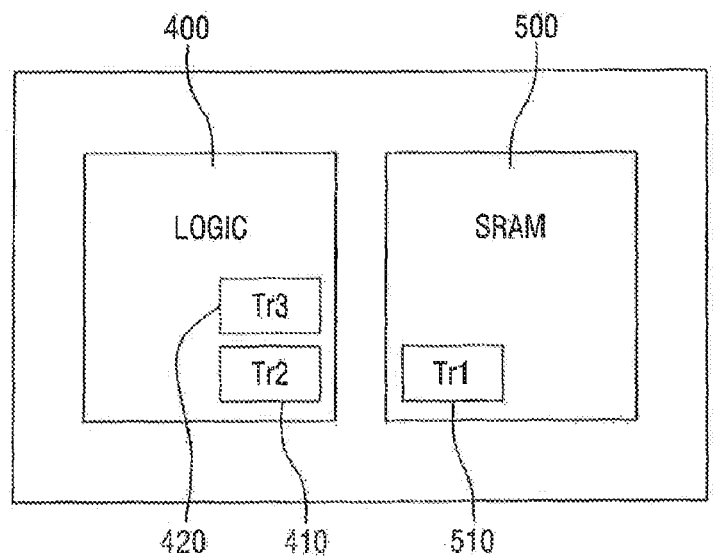
FIG. 13 is a diagram of a semiconductor device according to an exemplary embodiment of the present inventive concept.
Figure 14:
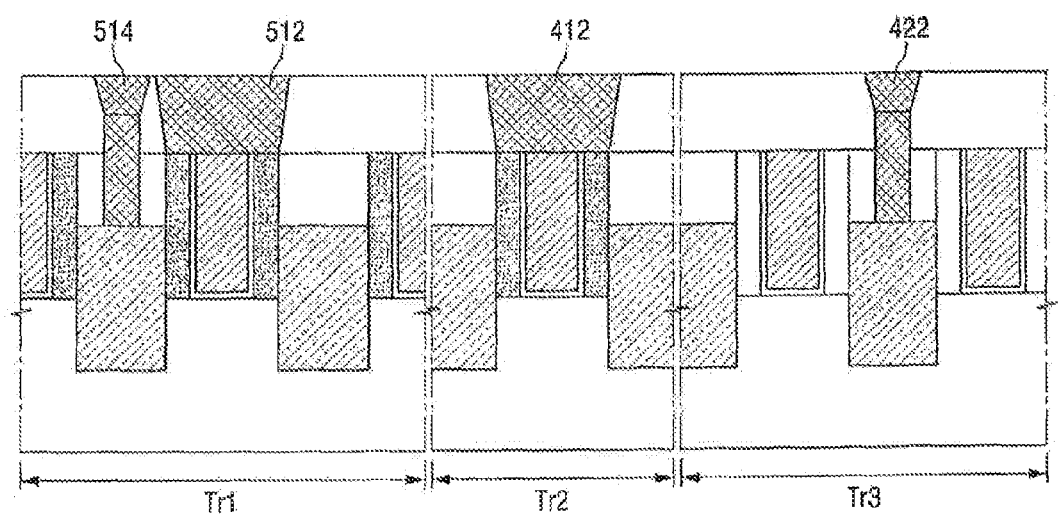
FIG. 14 is a cross-sectional view of the semiconductor device shown in FIG. 13.

FIG. 13 is a diagram of a semiconductor device according to an exemplary embodiment of the present inventive concept and FIG. 14 is a crosssectional view of the semiconductor device shown in FIG. 13.

Referring to FIGS. 9 and 13, in the semiconductor device according to the current embodiment of the present inventive concept, a second transistor 410 and a third transistor 420 may be disposed in a logic region 400 and a first transistor 510 may be disposed in an SRAM forming region 500.

The first transistor 510 and the second transistor 410 may include the second gate pattern 200 and the second insulation layer 210 formed in the second region H shown in FIG. 9, and the third transistor 420 may include the first gate pattern 100 and the first insulation layer 110 formed in the first region I shown in FIG. 9.

Referring to FIGS. 9 and 14, a first gate contact 512 is formed on a gate pattern of the first transistor 510 having the second insulation layer 210 formed on the sidewalls thereof. In addition, a first source/drain contact 514 is formed on a source/drain of the first transistor 510. A second gate contact 412 is formed on a gate pattern of the second transistor 410 having the second insulation layer 210 formed on the sidewalls thereof. In the illustrated embodiment, however, a contact is not formed on the source/drain of the second transistor 410, but exemplary embodiments of the present inventive concept are not limited thereto. A second source/drain contact 422 may be formed only on the source/drain of the third transistor 420 while a contact is not formed on a gate pattern of the third transistor 420 having the first insulation layer 110 including the first air gap 110a formed at the sidewalls thereof.

FIG. 13 illustrates the logic region 400 and the SRAM forming region 500, but exemplary embodiments of the present inventive concept are not limited thereto. For example, the present inventive concept may also be applied to a memory forming region other than the logic region 400 region, (e.g., dynamic random access memory (DRAM), magnetic random access memory (MRAM), resistive random access memory (RRAM), phase-change random access memory (PRAM), etc.).

A semiconductor device according to an exemplary embodiment of the present inventive concept will be described with reference to FIG. 15.

Figure 15:
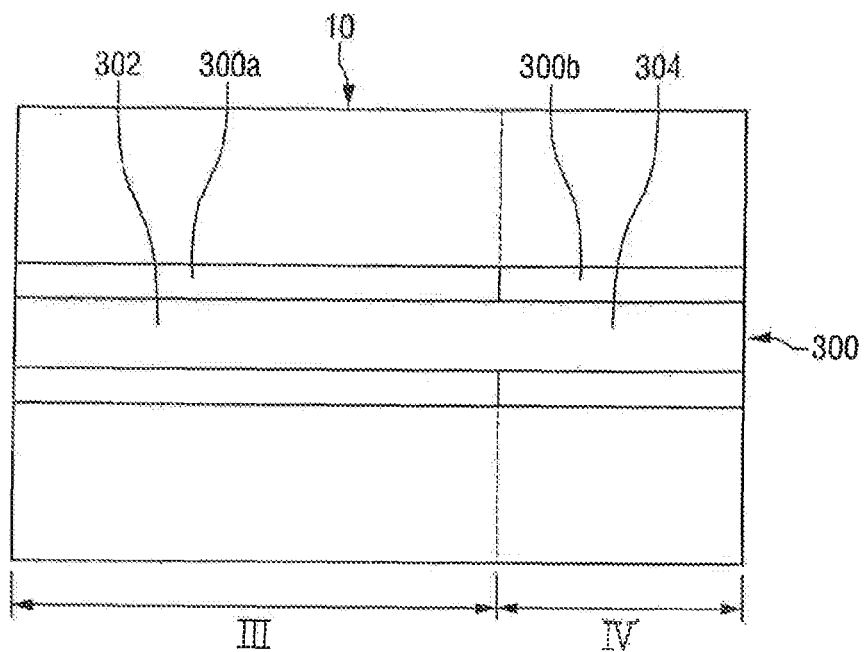
FIG. 15 is a diagram of a semiconductor device according to an exemplary embodiment of the present inventive concept.

FIG. 15 is a diagram of a semiconductor device according to an exemplary embodiment of the present inventive concept.

Referring to FIG. 15, a third region III and a fourth region IV may be defined on a substrate 10. A third gate pattern 300 may be formed on the substrate 10 across the third region III and the fourth region IV. A portion of the third gate pattern 300 formed on the third region III may be a first portion 302, and a portion of the third gate pattern 300 formed on the fourth region IV may be a second portion 304.

A third insulation layer 300a may be formed on sidewalls of the first portion 302 of the third gate pattern 300, and a fourth insulation layer 300b may be formed on sidewalls of the second portion 304 of the third gate pattern 300. A dielectric constant of the third insulation layer 300a may be different from a dielectric constant of the fourth insulation layer 300b. In other words, the third gate pattern 300 may be divided into the first portion 302 and the second portion 304 and insulation layers having different dielectric constants may be formed on sidewalls of the first and second portions 302 and 304, respectively.

For example, it is assumed that the dielectric constant of the third insulation layer 300a may be smaller than that of the fourth insulation layer 300b and the third insulation layer 300a includes an air gap. Here, a contact for an electrical connection with an upper interconnection line is not formed on the first portion 302 of the third gate pattern 300 and a contact may be formed only on the source/drain positioned adjacent to a lateral surface of the first portion 302. However, a contact for an electrical connection with an upper interconnection line may be formed on the second portion 304 of the third gate pattern 300 and a contact may also be formed on the source/drain positioned adjacent to a lateral surface of the second portion 304.

Hereinafter, a method for fabricating a semiconductor device according to an exemplary embodiment of the present inventive concept will be described with reference to FIGS. 9 and 16 to 19.

FIGS. 16 to 19 are cross-sectional views illustrating intermediate process steps of a method for fabricating a semiconductor device according to an exemplary embodiment of the present inventive concept.

In an exemplary embodiment of the present inventive concept, a gate pattern including a high-k gate insulation film and a metal gate electrode is formed by forming a source/drain and then removing a dummy gate pattern. However, a source/drain may be formed after forming a gate insulation film and a gate electrode sequentially stacked on a substrate without a dummy gate pattern. In addition, a gate pattern may also be formed such that a dummy gate pattern including a gate insulation film and a dummy gate electrode is formed, a source/drain is formed at both sides of the dummy gate pattern, and the dummy gate electrode is then removed to form a metal gate electrode.

Figure 16:
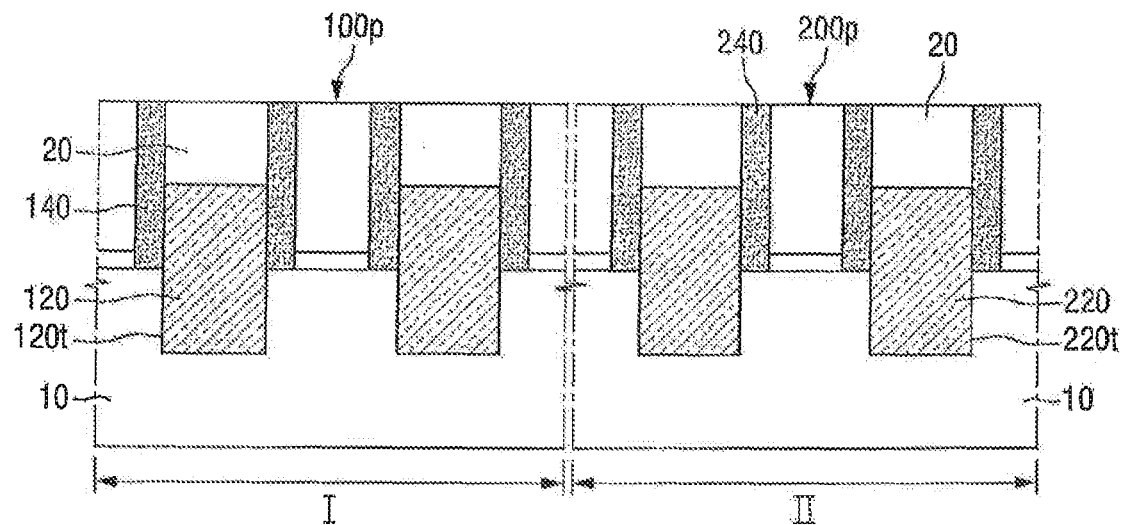
FIGS. 16 to 19 are cross-sectional views illustrating intermediate process steps of a method for fabricating a semiconductor device according to an exemplary embodiment of the present inventive concept.

Referring to FIG. 16, a first dummy gate pattern 100p and a second dummy gate pattern 200p are formed on a first region I and a second region II defined on a substrate 10. The first and second dummy gate patterns 100p and 200p may include a dummy gate insulation film and a dummy gate electrode, respectively. A first spacer 140 and a second spacer 240 may be formed on sidewalls of the first dummy gate pattern 100p and the second dummy gate pattern 200p, respectively. The first spacer 140 and the second spacer 240 may be made of a material having a third dielectric constant. For example, the first spacer 140 and the second spacer 240 may be nitride films.

Thereafter, to form a source/drain, a first trench 120t may be formed at both sides of the first spacer 140 and a second trench 220t may be formed at both sides of the second spacer 240. The first trench 120t and/or the second trench 220t may have various sections according to, for example, the type of semiconductor device. The first trench 120t and the second trench 220t may be formed by dry etching, wet etching or a combination thereof.

A first source/drain 120 may be formed in the first trench 120t and a second source/drain 220 may be formed in the second trench 220t. Top surfaces of the first source/drain 120 and the second source/drain 220 may be elevated from the substrate 10. The elevated first source/drain 120 and the elevated second source/drain 220 may be formed by epitaxially growing, for example, a semiconductor material. The first source/drain 120 and the second source/drain 220 may be formed by, for example, chemical vapor deposition (CVD) or atomic layer deposition (ALD).

An insulation film (not shown) covering the first dummy gate pattern 100p and the second dummy gate pattern 200p may be formed on the substrate 10. Thereafter, the insulation film may be planarized to expose the first and second dummy gate patterns 100p and 200p. A first interlayer dielectric film 20 surrounding lateral surfaces of the first dummy gate pattern 100p and the second dummy gate pattern 200p may be formed by planarizing the insulation film. Widths of upper portions of the first spacer 140 and the second spacer 240 exposed by the first interlayer dielectric film 20 may be substantially the same as those of lower portions thereof contacting the substrate 10, but exemplary embodiments of the present inventive concept are not limited thereto. The upper portions of the first spacer 140 and/or the second spacer 240 may have widths large enough to remove the first spacer 140 and/or the second spacer 240 in a subsequent process.

Figure 17:
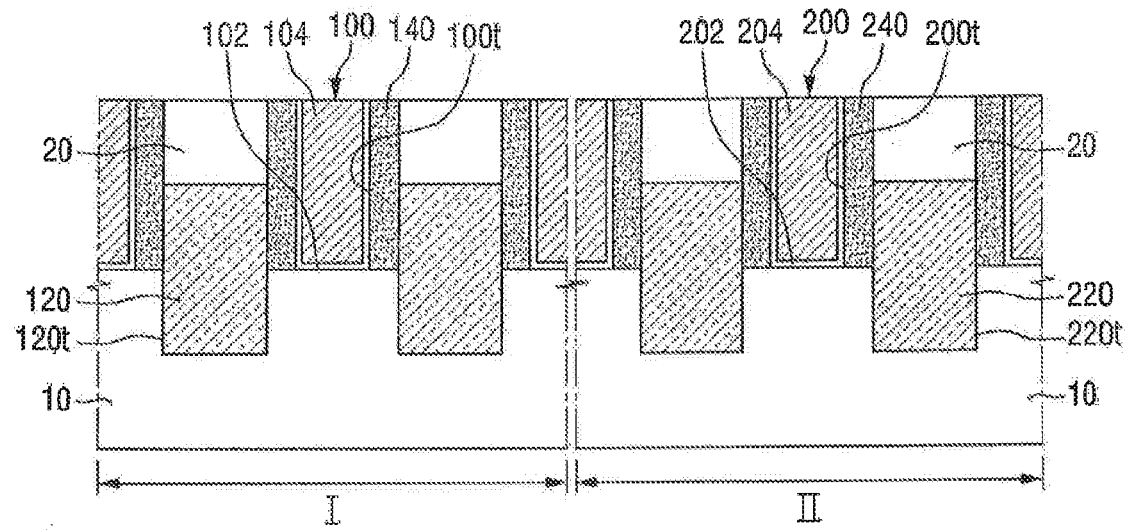

Referring to FIG. 17, a first gate pattern 100 having the first spacer 140 disposed on sidewalls thereof may be formed on the first region I, and a second gate pattern 200 having the second spacer 240 disposed on sidewalls thereof may be formed on the second region II. The first gate pattern 100 may include a first high-k gate insulation film 102 and a first metal gate electrode 104. The second gate pattern 200 may include a second high-k gate insulation film 202 and a second metal gate electrode 204.

For example, a third trench 100t and a fourth trench 200t may be formed in the first interlayer dielectric film 20 by removing the first dummy gate pattern (100p of FIG. 16) and the second dummy gate pattern (200p of FIG. 16), respectively. The third trench 100t may have the first spacer 140 as 110 as its sidewall, and the fourth trench 200t may have the second spacer 240 as its sidewall. The third trench 100t and the fourth trench 200t may expose the substrate 10, respectively, but exemplary embodiments of the present inventive concept are not limited thereto.

Before forming the first and second high-k gate insulation films 102 and 202 in the third trench 100t and the fourth trench 200t, a chemical silicon oxide film (not shown) may be formed on the exposed substrate 10 on the first region I and the second region II. The chemical silicon oxide film improves bonding between the substrate 10 and the first and second high-k gate insulation films 102 and 202, thereby reducing interface defects and improving the reliability of the semiconductor device. The chemical silicon oxide film may be formed by treating the substrate 10 using, for example, a chemical material. For example, the substrate 10 is treated using a solution containing an oxygen source material and ammonia ($NH_3$) and a predetermined region of the substrate 10 is oxidized by the oxygen source material, thereby forming the chemical silicon oxide film. Here, hydrogen peroxide may be used as the oxygen source material, but the oxygen source material is not limited thereto.

The first and second high-k gate insulation films 102 and 202 may be conformally formed in the third trench 100t and the fourth trench 200t. In other words, the first and second high-k gate insulation films 102 and 202 may be formed on the bottom and side surfaces of the third and fourth trenches 100t and 200t with a uniform thickness. The first and second high-k gate insulation films 102 and 202 may be formed by, for example, CVD, physical vapor deposition (PVD), or ALD.

The first metal gate electrode 104 may be formed on the first high-k gate insulation film 102 and the second metal gate electrode 204 may be formed on the second high-k gate insulation film 202. The first and second metal gate electrodes 104 and 204 may be formed by, for example, CVD, PVD, or ALD.

Figure 18:
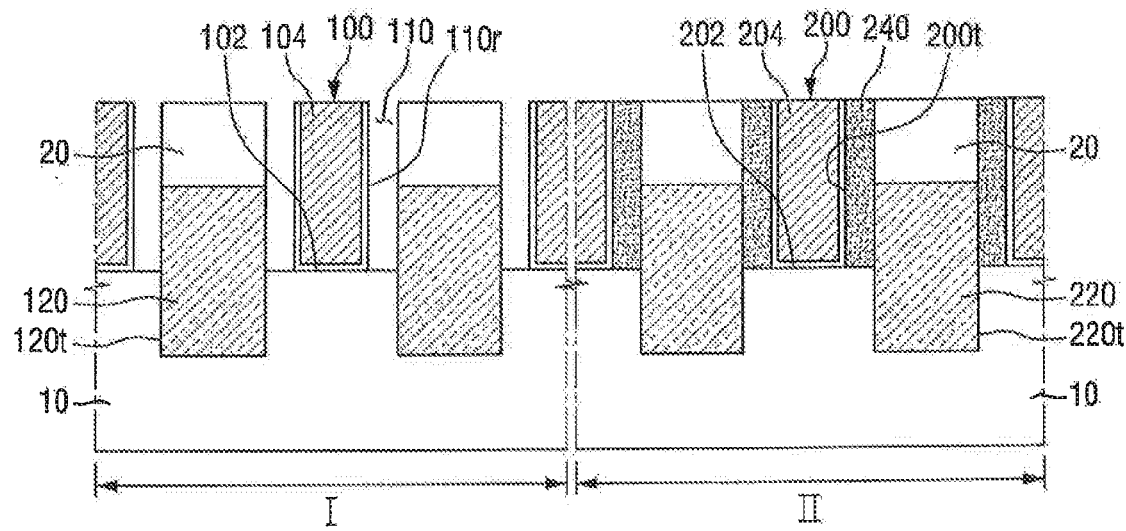

Referring to FIG. 18, the first spacer 140 may be removed, thereby forming the first recess 110r. After forming a passivation film pattern (not shown) covering the second region II, the first spacer 140 of the first region I may be removed. The first spacer 140 may be removed by, for example, dry etching, wet etching or a combination thereof. When the first spacer 140 is removed by dry etching, it may be removed by anisotropic etching, isotropic etching or a combination thereof. In removing the first spacer 140, only the first spacer 140 is selectively removed. Therefore, the first spacer 140 may have high etching selectivity over the first gate pattern 100 or the first interlayer dielectric film 20. For example, the etching selectivity of the first spacer 140 over the first metal gate electrode 104 or the first interlayer dielectric film 20 may be 3:1 or greater.

The first recess 110r may have the first gate pattern 100 and the first source/drain 120 as its sidewalls and the substrate 10 as it bottom surface. In the illustrated embodiment, the substrate 10 of the first region I is exposed by the first recess 110r, but exemplary embodiments of the present inventive concept are not limited thereto. In other words, a portion of the first spacer 140 may remain between the first recess 110r and the substrate 10.

Figure 19:
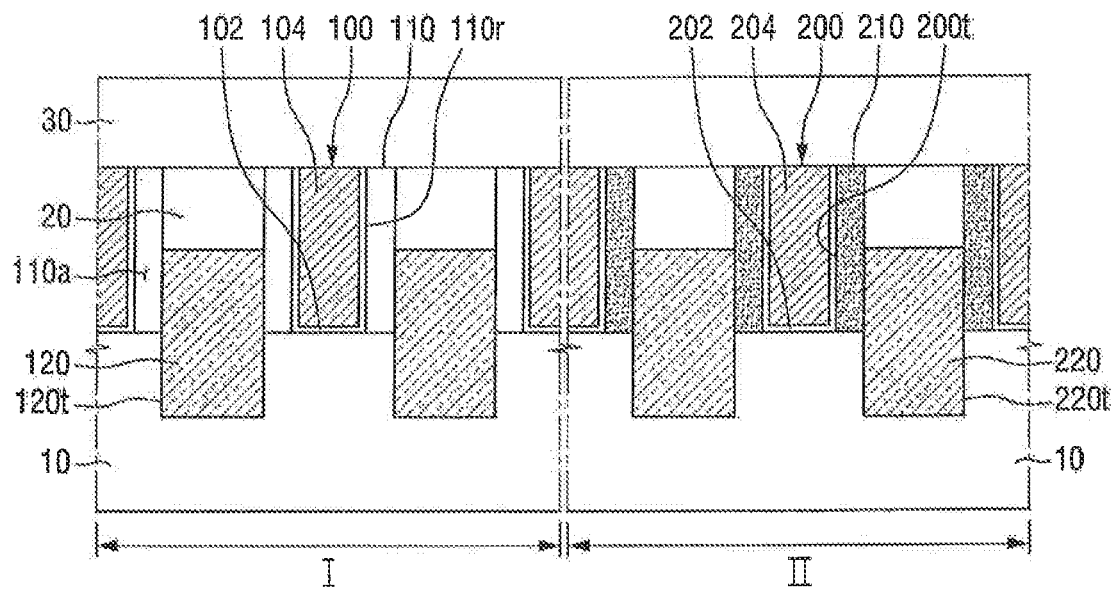

Referring to FIG. 19, a second interlayer dielectric film 30 entirely covering the first region I and the second region II may be formed. A first air gap 110a may be formed at the sidewalls of the first gate pattern 100 by the second interlayer dielectric film 30 on the first region I. In other words, the first insulation layer 110 having a first dielectric constant may be formed on the sidewalls of the first gate pattern 100. The second interlayer dielectric film 30 on the second region II may cover the second gate pattern 200 and the second spacer (240 of FIG. 18). The second spacer may correspond to the second insulation layer 210 formed on the sidewalls of the second gate pattern 200. A second dielectric constant of the second insulation layer 210 may be the same as that of the second spacer. Therefore, the first insulation layer 110 and the second insulation layer 210 having different dielectric constants are formed on the sidewalls of the first gate pattern 100 and the second gate pattern 200, respectively.

The second interlayer dielectric film 30 may include, for example, silicon oxide (SiO) or a low-k material, or may be doped with an impurity. The second interlayer dielectric film 30 may be formed by, for example, CVD. The second interlayer dielectric film 30 may be made of a material having low step coverage. If the second interlayer dielectric film 30 is made of a material having high step coverage, it may be recessed by a large amount in the first recess 110r, thereby reducing the size of the first air gap 110a. In addition, the second interlayer dielectric film 30 may fill the first recess 110r, so that an air gap may not be formed. Although not shown, a portion of the second interlayer dielectric film 30 may be recessed into the first recess 110r, thereby filling an upper portion of the first recess 110r.

Referring to FIG. 9, a first via 132 and a first contact 134 may be formed on a first source/drain 120 on a first region I to then be electrically connected to the first source/drain 120. A second contact 230 may be formed on a second gate pattern 200 of a second region II to then be electrically connected to the second gate pattern 200.

Hereinafter, a method for fabricating a semiconductor device according to an exemplary embodiment of the present inventive concept will be described with reference to FIGS. 9 and 16 to 20. This embodiment is substantially the same as the previous embodiment, except that a liner is formed.

Figure 20:
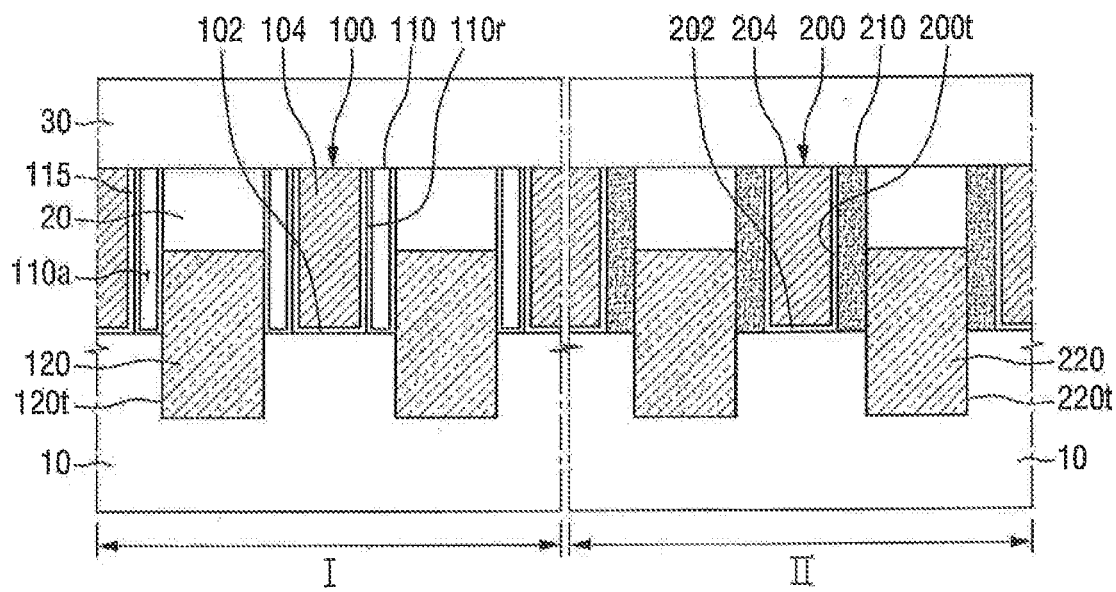
FIG. 20 is a cross-sectional view illustrating an intermediate process step of a method for fabricating a semiconductor device according to an exemplary embodiment of the present inventive concept.

FIG. 20 is a cross-sectional view illustrating an intermediate process step of a method for fabricating a semiconductor device according to an exemplary embodiment of the present inventive concept.

Referring to FIG. 20, a liner 115 conformally covering the first recess 110r may further be formed. Since the liner 115 is formed in the first recess 110r with a uniform thickness, it may be formed using a material having high step coverage and a deposition method thereof. The liner 115 may be, for example, an oxide film or a nitride film, formed by ALD.

After forming the liner 115, a second interlayer dielectric film 30 entirely covering the first region I and the second region II may be formed. Since the second interlayer dielectric film 30 is formed on the first recess 110r having the liner 115, a first air gap 110a may be formed.

Hereinafter, a method for fabricating a semiconductor device according to an exemplary embodiment of the present inventive concept will be described with reference to FIGS. 9, 16 to 18 and 21.

Figure 21:
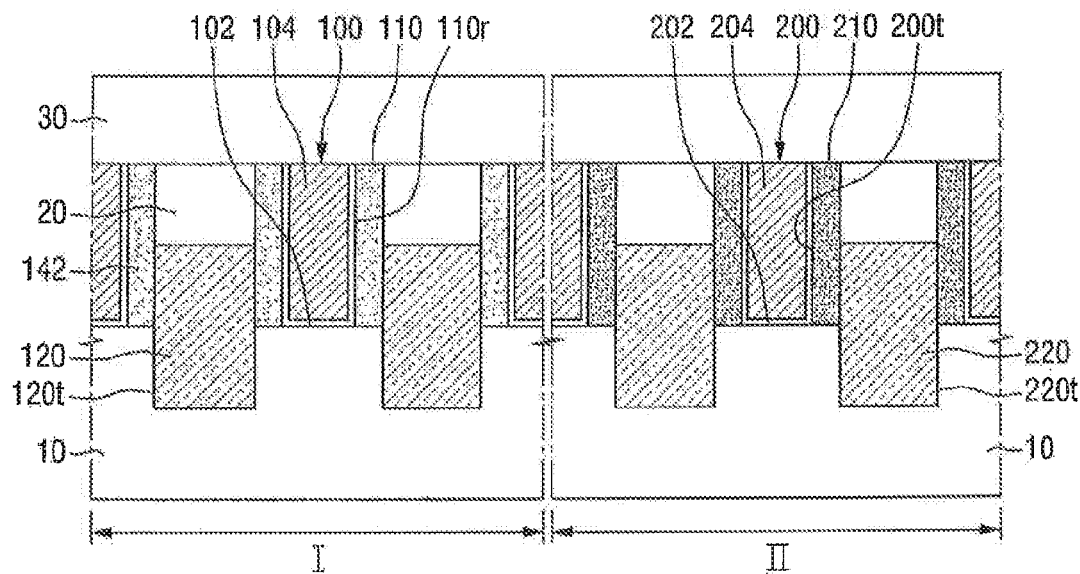
FIG. 21 is a cross-sectional view illustrating an intermediate process step of a method for fabricating a semiconductor device according to an exemplary embodiment of the present inventive concept.

FIG. 21 is a cross-sectional view illustrating an intermediate process step of a method for fabricating a semiconductor device according to an exemplary embodiment of the present inventive concept.

Referring to FIG. 21, a first recess 110r may be filled with an insulating material 142. The first recess 110r filled with the insulating material 142 is covered by a second interlayer dielectric film 30, thereby forming a first insulation layer 110. The first insulation layer 110 having the insulating material 142 may have a first dielectric constant. The insulating material 142 may be formed as, for example, an oxide, a low-k oxide or a low-k nitride. For example, the insulating material 142 may include $SiO_2$, SiOCH, SiOF, SiCN, SiOCN or combinations thereof. The second interlayer dielectric film 30 on a second region II may cover a second gate pattern 200 and a second spacer (240 of FIG. 18). The second spacer becomes a second insulation layer 210 formed on sidewalls of the second gate pattern 200. Since a dielectric constant of the second spacer (240 of FIG. 18) formed of a nitride film is different from that of the insulating material 142, the first insulation layer 110 and the second insulation layer 210 having different dielectric constants are formed on the sidewalls of the first gate pattern 100 and the second gate pattern 200.

For example, an insulating material film (not shown) covering the first recess 110r may be formed on a first region I. The insulating material film may fill the first recess 110r and may cover the first gate pattern 100. The insulating material film may also cover both of the first region I and the second region II. Since the insulating material film may be capable of filling the first recess 110r, it may be made of a material having high step coverage. In addition, the insulating material film may be formed using a deposition method having high step coverage. For example, the insulating material film may be formed using one of ALD, CVD, plasma enhanced CVD (PE CVD), spin on glass (SOG) and flowable CVD (FCVD). After forming the insulating material film, an etch back process is performed to expose the first gate pattern 100 and the second gate pattern 200. The second interlayer dielectric film 30 is formed on the exposed first gate pattern 100 and second gate pattern 200, thereby forming the first insulation layer 110 and the second insulation layer 210.

Hereinafter, a method for fabricating a semiconductor device according to an exemplary embodiment of the present inventive concept will be described with reference to FIGS. 9, 16, 17, and 22 to 24.

Figure 22:
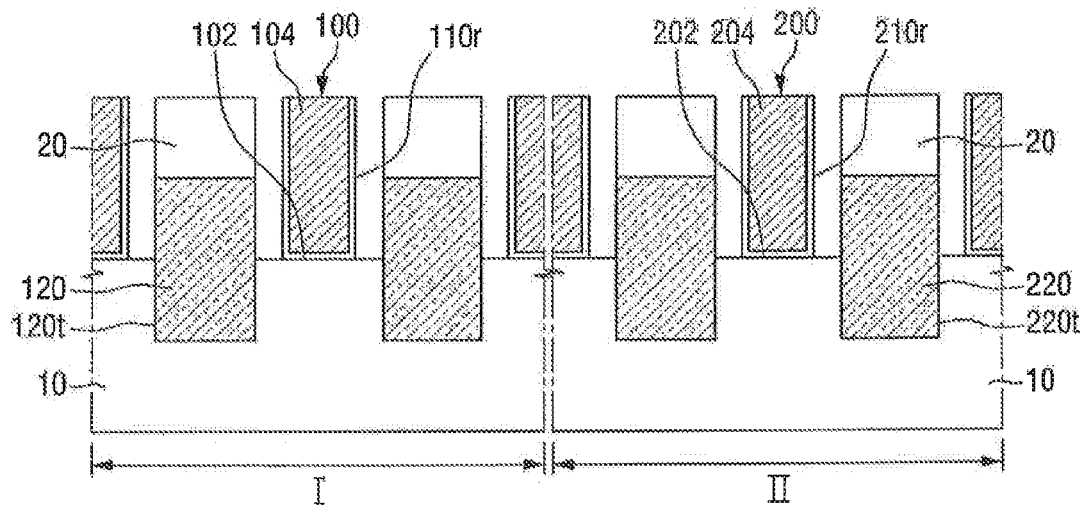
FIGS. 22 to 24 are cross-sectional views illustrating intermediate process steps of a method for fabricating a semiconductor device according to an exemplary embodiment of the present inventive concept.
Figure 23:
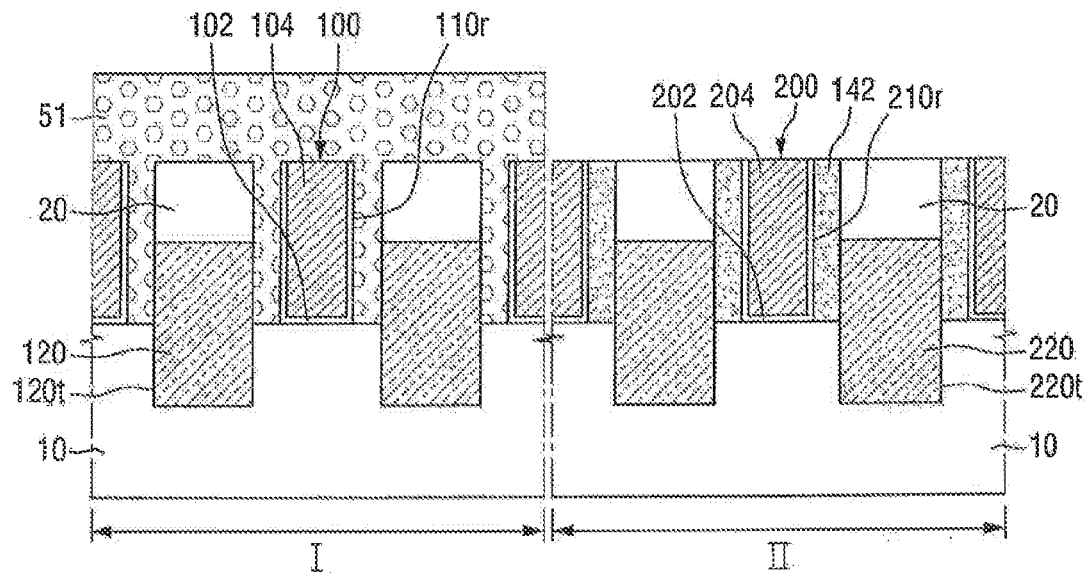
Figure 24:
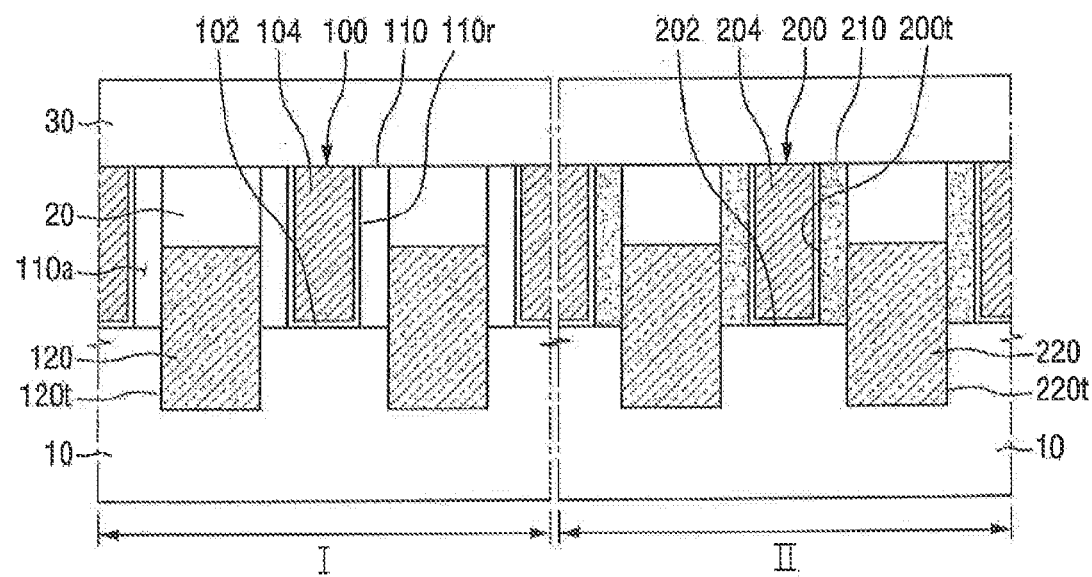

FIGS. 22 to 24 are cross-sectional views illustrating intermediate process steps of a method for fabricating a semiconductor device according to an exemplary embodiment of the present inventive concept.

Referring to FIG. 22, a first spacer 140 and a second spacer 240 are simultaneously removed, thereby forming a first recess 110r on sidewalls of a first gate pattern 100 and a second recess 210r on sidewalls of a second gate pattern 200. Methods of removing the first and second spacers 140 and 240 and etching selectivity of the first or second spacer 140 or 240 over the first gate pattern 100, the second gate pattern 200 or the first interlayer dielectric film 20 are substantially the same as those described above with reference to FIG. 18, and thus repeated explanations thereof will be omitted.

Referring to FIG. 23, a first photoresist film pattern 51 covering the first recess 110r is formed on the first region I. The second recess 210r on the second region II without the first photoresist film pattern 51 is exposed. An insulating material film is formed on the second region II, thereby covering the exposed second recess 210r and the second gate pattern 200. Thereafter, an etch back process is performed to expose the second gate pattern 200, thereby forming a second insulation layer 210 on sidewalls of the second gate pattern 200.

Referring to FIG. 24, after forming the second insulation layer 210 by filling the second recess 210r with an insulating material 142, the first photoresist film pattern 51 may be removed. The removing of the first photoresist film pattern 51 exposes the first recess 110r. The exposed first recess 110r is not filled with a material other than air. After exposing the first recess 110r, a second interlayer dielectric film 30 entirely covering the first region I and the second region II may be formed. A first air gap 110a may be formed at sidewalls of the first gate pattern 100. A first insulation layer 110 having a first dielectric constant and including the first air gap 110a is formed on sidewalls of a first gate pattern 100, and a second insulation layer 210 having a second dielectric constant and including the insulating material 142 is formed on sidewalls of the second gate pattern 200. Since dielectric constants of the air and the insulating material 142 are different from each other, the first insulation layer 110 and the second insulation layer 210 having different dielectric constants are formed on the sidewalls of the first gate pattern 100 and the second gate pattern 200, respectively.

Hereinafter, a method for fabricating a semiconductor device according to an exemplary embodiment of the present inventive concept will be described with reference to FIGS. 9, 16, 17, 22, and 24 to 26.

Figure 25:
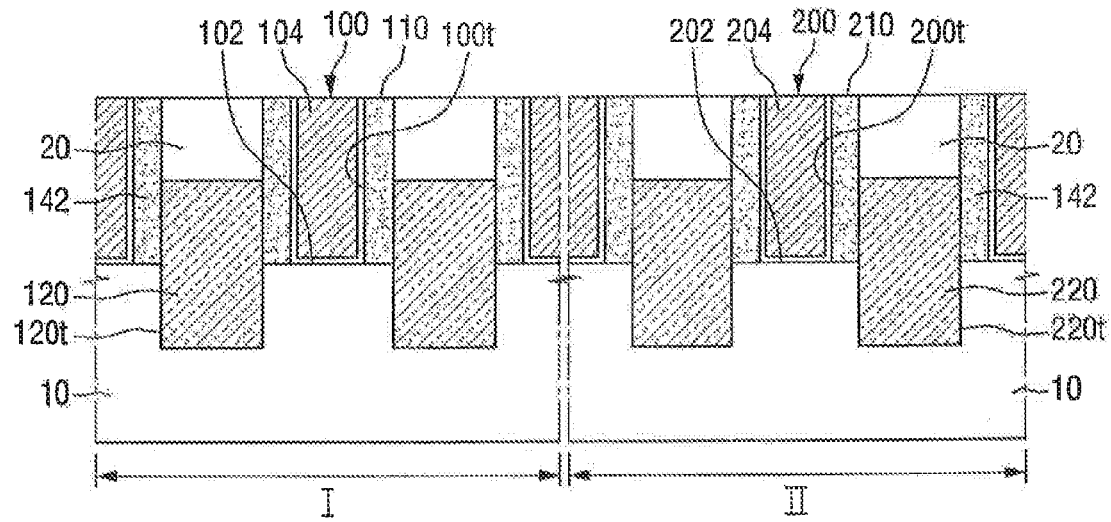
FIGS. 25 and 26 are cross-sectional views illustrating intermediate process steps of a method for fabricating a semiconductor device according to an exemplary embodiment of the present inventive concept.
Figure 26:
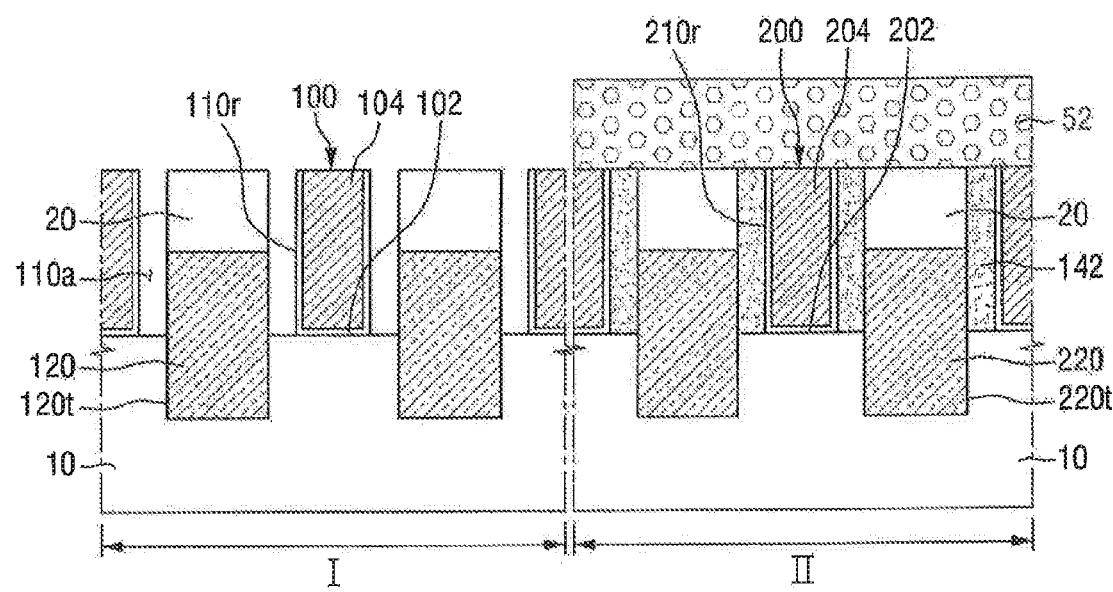

FIGS. 25 and 26 are cross-sectional views illustrating intermediate process steps of a method for fabricating a semiconductor device according to an exemplary embodiment of the present inventive concept.

Referring to FIG. 25, an insulating material film (not shown) covering a first region I and a second region II may be formed. The insulating material film may completely fill a first recess 110r (110r of FIG. 26) and a second recess 210r (210r of FIG. 26). Thereafter, an etch back process may be performed to expose a first gate pattern 100 and a second gate pattern 200. The second recess 210r may be filled with an insulating material 142, thereby forming a second insulation layer 210 on sidewalls of the second gate pattern 200. The first recess 110r may also be filled with the insulating material 142.

Referring to FIG. 26, a second photoresist film pattern 52 covering the second gate pattern 200 and the second insulation layer 210 may be formed on the second region II. The insulating material 142 filling the first recess 110r is removed using the second photoresist film pattern 52 as an etch mask. The exposed first recess 110r is not filled with a material other than air.

Referring to FIG. 24, after removing the insulating material 142 in the first recess 110r, the second photoresist film pattern 52 may be removed. After removing the second photoresist film pattern 52, a second interlayer dielectric film 30 entirely covering the first region I and the second region II may be formed. A first air gap 110a may be formed at sidewalls of the first gate pattern 100. The first insulation layer 110 and the second insulation layer 210 having different dielectric constants are formed on the sidewalls of the first gate pattern 100 and the second gate pattern 200, respectively.

Hereinafter, a method for fabricating a semiconductor device according to an exemplary embodiment of the present inventive concept will be described with reference to FIGS. 9, 16, 17, 22, 25 and 27.

Figure 27:
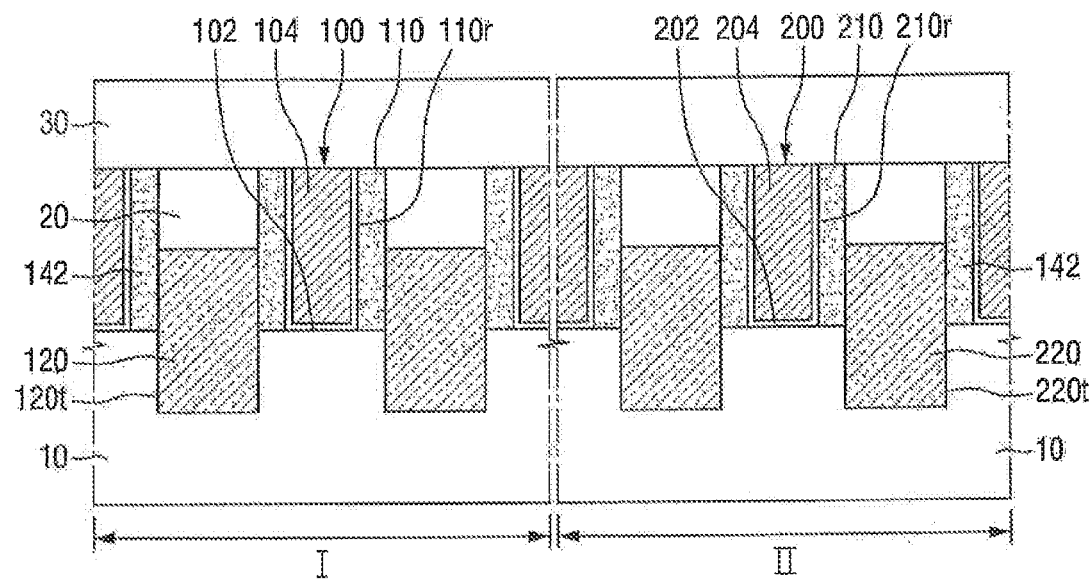
FIG. 27 is a cross-sectional view illustrating an intermediate process step of a method for fabricating a semiconductor device according to an exemplary embodiment of the present inventive concept.

FIG. 27 is a cross-sectional view illustrating an intermediate process step of a method for fabricating a semiconductor device according to an exemplary embodiment of the present inventive concept.

Referring to FIG. 27, the second interlayer dielectric film 30 may be formed on the first recess 110r and the second recess 210r filled with the insulating material 142. The second interlayer dielectric film 30 may entirely cover both of the first region I and the second region II. The first recess 110r and the second recess 210r are covered by the second interlayer dielectric film 30, thereby forming a first insulation layer 110 and a second insulation layer 210 on sidewalls of a first gate pattern 100 and a second gate pattern 200, respectively. Since the first insulation layer 110 and the second insulation layer 210 are formed by filling the first recess 110r and the second recess 210r with the insulating material 142, a first dielectric constant of the first insulation layer 110 and a second dielectric constant of the second insulation layer 210 may be the same as each other.

Hereinafter, a method for fabricating a semiconductor device according to an exemplary embodiment of the present inventive concept will be described with reference to FIGS. 10A, 16, 17, and 28 to 30.

Figure 28:
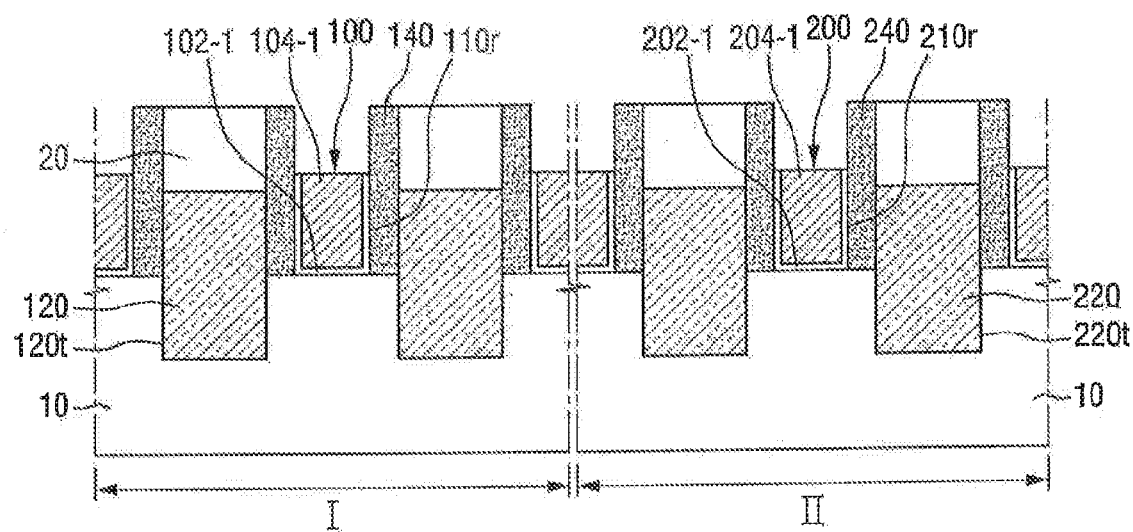
FIGS. 28 to 30 are cross-sectional views illustrating intermediate process steps of a method for fabricating a semiconductor device according to an exemplary embodiment of the present inventive concept.
Figure 29:
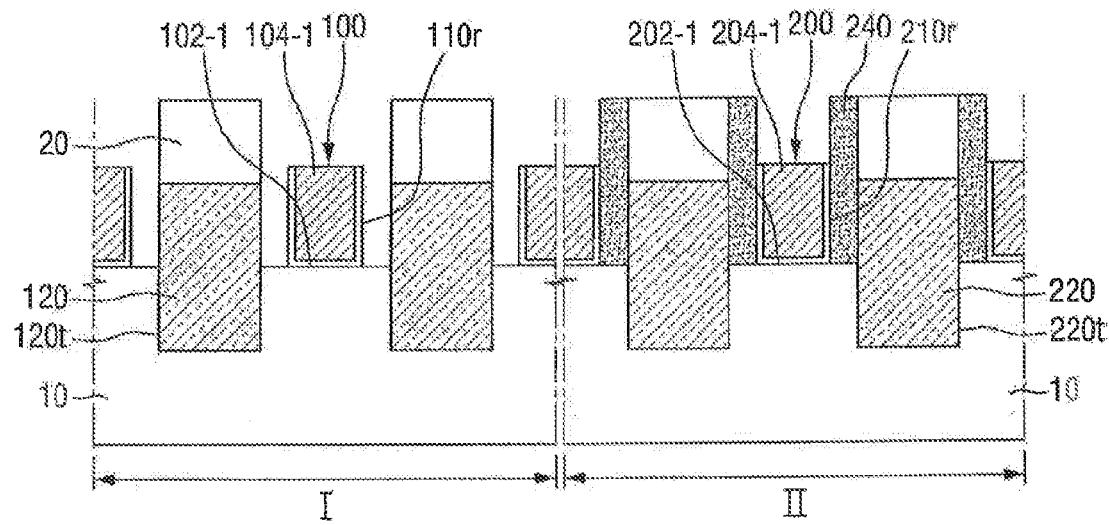
Figure 30:
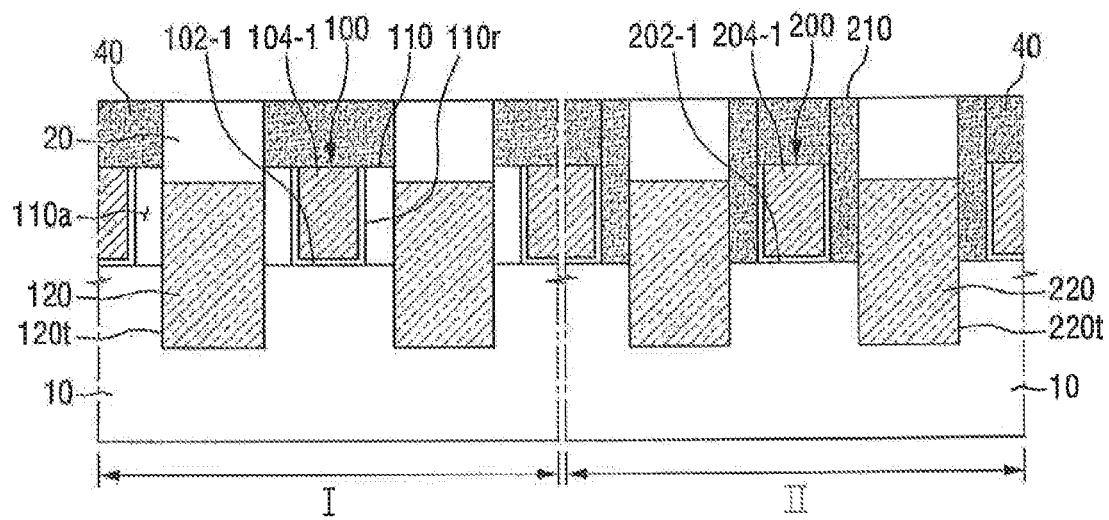

FIGS. 28 to 30 are cross-sectional views illustrating intermediate process steps of a method for fabricating a semiconductor device according to an exemplary embodiment of the present inventive concept.

Referring to FIG. 28, an exposed first gate pattern 100 and an exposed second gate pattern 200 are recessed to make top surfaces of the first gate pattern 100 and the second gate pattern 200 lower than top portions of a first spacer 140 and a second spacer 240, respectively. Thereafter, a metal pull back process may be performed, thereby forming a first recessed metal gate electrode 104-1 and a second recessed metal gate electrode 204-1. Then, a high-k gate insulation film protruding more than the first and second recessed metal gate electrodes 104-1 and 204-1 is removed, thereby forming first and second recessed high-k gate insulation films 102-1 and 202-1. Top surfaces of the first and second recessed metal gate electrodes 104-1 and 204-1 may be made to be coplanar with top surfaces of the first and second recessed high-k gate insulation films 102-1 and 202-1. Here, the metal gate electrode and the high-k gate insulation film may be simultaneously recessed, thereby simultaneously forming the first and second recessed metal gate electrodes 104-1 and 204-1 and the first and second recessed high-k gate insulation films 102-1 and 202-1.

Referring to FIG. 29, the first spacer 140 may be removed, thereby forming a first recess 110r on sidewalls of the first gate pattern 100. After a passivation film pattern (not shown)

is formed covering the second region II, the first spacer 140 of the first region I may be removed. The first spacer 140 may be removed by, for example, wet etching, dry etching or remote plasma. The first spacer 140 may be removed by, for example, isotropical etching. In removing the first spacer 140, only the first spacer 140 is selectively removed. Therefore, the first spacer 140 may have high etching selectivity over the first gate pattern 100 or the first interlayer dielectric film 20. For example, the etching selectivity of the first spacer 140 over the first recessed metal gate electrode 104-1 or the first interlayer dielectric film 20 may be 3:1 or greater.

As a result of forming the first recess 110r, the first gate pattern 100 may be surrounded by an air layer shaped of the letter "U" clockwise rotated 90 degrees. A depth of the first recess 110r is smaller than a height measured from the substrate 10 to the top surface of the first interlayer dielectric film 20. In the illustrated embodiment, the substrate 10 of the first region I is exposed by the first recess 110r, but exemplary embodiments of the present inventive concept are not limited thereto. In other words, a portion of the first spacer 140 may remain between the first recess 110r and the substrate 10.

Referring to FIG. 30, a blocking film (not shown) may be formed on the first region I and the second region II. The blocking film may be planarized to expose the first interlayer dielectric film 20 and the second spacer 240, thereby forming a blocking pattern 40 on the first gate pattern 100 and the second gate pattern 200. A first air gap 110a may be formed at sidewalls of the first gate pattern 100 by the blocking pattern 40 formed directly on the first gate pattern 100. In other words, a first insulation layer 110 having a first dielectric constant may be formed on the sidewalls of the first gate pattern 100. The second spacer 240 may become a second insulation layer 210 formed on the sidewalls of the second gate pattern 200. A second dielectric constant of the second insulation layer 210 may be the same as a dielectric constant of the second spacer 240. Therefore, the first insulation layer 110 and the second insulation layer 210 having different dielectric constants may be formed on the sidewalls of the first gate pattern 100 and the second gate pattern 200, respectively.

Before forming the blocking pattern 40, a liner (not shown) conformally covering the first recess 110r may further be formed.

Although the blocking pattern 40 formed directly on the first gate pattern 100 extends to the first insulation layer 110, the blocking pattern 40 formed directly on the second gate pattern 200 may have the same width as that of the second gate pattern 200. In the illustrated embodiment, no void is present in the blocking pattern 40. However, a void may be formed in the blocking pattern 40 according to the formation condition of the blocking pattern 40. While a height of the first insulation layer 110 may be substantially the same as a height of the first gate pattern 100, a height of the second insulation layer 210 is greater than a height of the second gate pattern 200.

The blocking pattern 40 may be formed by, for example, high density plasma CVD (HDP CVD), PE CVD, or CVD. If the method of forming the blocking pattern 40 provides high step coverage, the first recess 110r may be filled by the blocking pattern 40 without an air gap. During deposition of the blocking pattern 40, the step coverage may be, for example, 80% or less. The blocking pattern 40 and first and second spacers (140 and 240 of FIG. 28) may be made of the same material, for example, nitride.

Hereinafter, a method for fabricating a semiconductor device according to an exemplary embodiment of the present inventive concept will be described with reference to FIGS. 10A, 16, 17, 28, 29 and 31.

Figure 31:
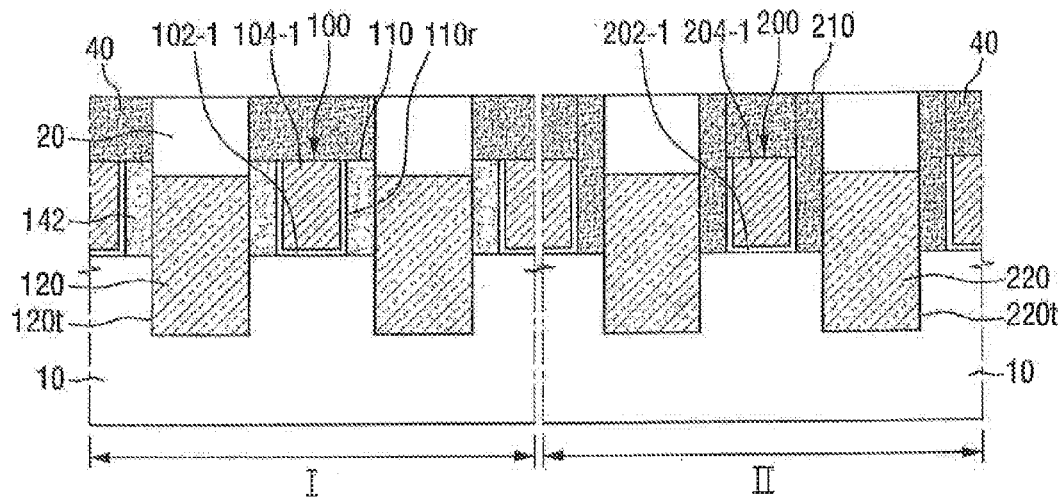
FIG. 31 is a cross-sectional view illustrating an intermediate process step of a method for fabricating a semiconductor device according to an exemplary embodiment of the present inventive concept.

FIG. 31 is a cross-sectional view illustrating an intermediate process step of a method for fabricating a semiconductor device according to an exemplary embodiment of the present inventive concept.

Referring to FIG. 31, a first recess 110r is filled with an insulating material 142. Thereafter, a blocking pattern 40 is formed, thereby forming a first insulation layer 110 on sidewalls of a first gate pattern 100. The insulating material 142 may be formed as, for example, an oxide, a low-k oxide or a low-k nitride. For example, the insulating material 142 may include $SiO_2$, SiOCH, SiOF, SiCN, SiOCN or combinations thereof. The insulating material 142 included in the first insulation layer 110 may be formed using one of ALD, CVD, PE CVD, SOG and FCVD. When the blocking pattern 40 is formed directly on the first gate pattern 100 and the first insulation layer 110, it may also be formed directly on the second gate pattern 200. The first insulation layer 110 including the insulating material 142 may have a first dielectric constant, and the second spacer (240 of FIG. 28) becomes a second insulation layer 210 formed on sidewalls of the second gate pattern 200. When the second spacer (240 of FIG. 28) is formed of a nitride film, the first insulation layer 110 and the second insulation layer 210 having different dielectric constants are formed on the sidewalk of the first gate pattern 100 and the second gate pattern 200, respectively.

Hereinafter, a method for fabricating a semiconductor device according to an exemplary embodiment of the present inventive concept will be described with reference to FIGS. 10A, 16, 17, 28, 32 and 33.

Figure 32:
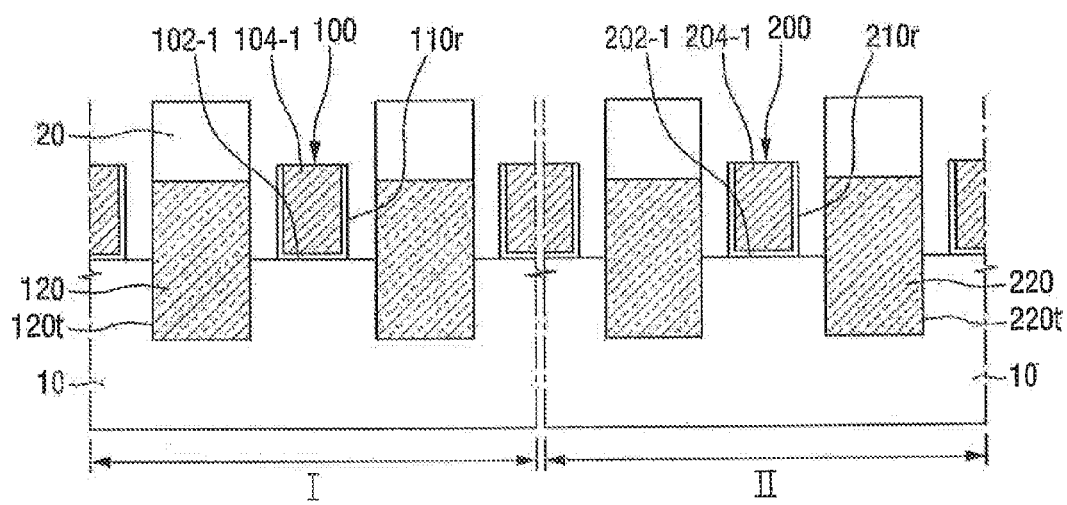
FIGS. 32 and 33 are cross-sectional views illustrating intermediate process steps of a method for fabricating a semiconductor device according to an exemplary embodiment of the present inventive concept.
Figure 33:
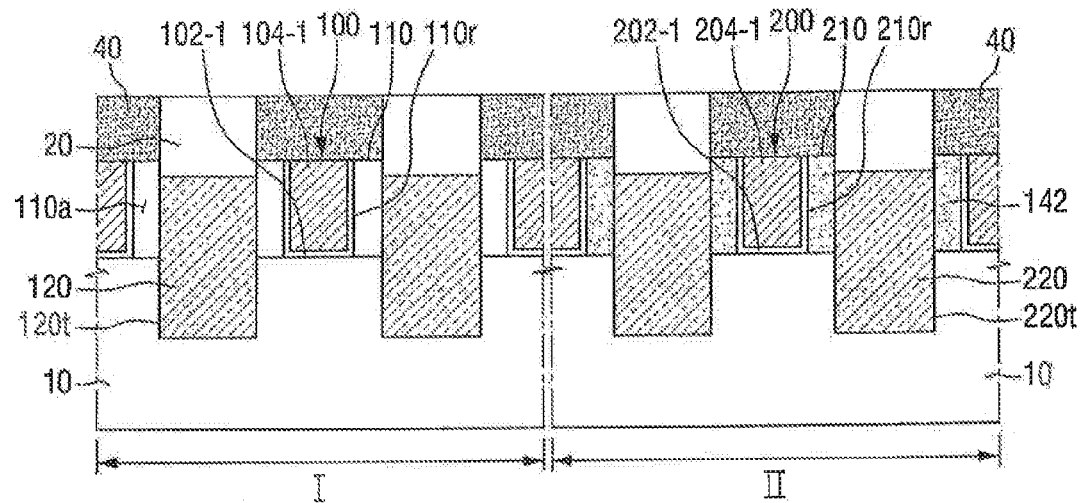

FIGS. 32 and 33 are cross-sectional views illustrating intermediate process steps of a method for fabricating a semiconductor device according to an exemplary embodiment of the present inventive concept.

Referring to FIG. 32, a first spacer 140 and a second spacer 240 are simultaneously removed, thereby forming a first recess 110r on sidewalls of a first gate pattern 100 and a second recess 210r on sidewalls of a second gate pattern 200. Methods of removing the first and second spacers 140 and 240 and etching selectivity of the first or second spacer 140 or 240 over the first gate pattern 100, the second gate pattern 200 or the first interlayer dielectric film 20 are substantially the same as those described above with reference to FIG. 29, and thus repeated explanations thereof will be omitted.

Referring to FIG. 33, the first recess 110r is left as an empty space while filling only the second recess 210r with an insulating material 142, thereby forming a second insulation layer 210 on sidewalls of the second gate pattern 200. Thereafter, a blocking pattern 40 may be formed between the first interlayer dielectric film 20 of a first region I and the first interlayer dielectric film 20 of a second region E1. The blocking pattern 40 formed directly on the first region I may be formed directly on the first gate pattern 100 and may extend directly above the first recess 110r. In addition, the blocking pattern 40 formed on the second region II may be formed directly on the second gate pattern 200 and the second insulation layer 210. A first insulation layer 110 having a first dielectric constant is formed on sidewalls of the first gate pattern 100 by the blocking pattern 40 formed directly on the first gate pattern 100. The first insulation layer 110 includes a first air gap 110a. A second insulation layer 210 having a second dielectric constant is formed on sidewalls of the second gate pattern 200. The second insulation layer 210 includes the insulating material 142. When the insulating material 142 is formed as, for example, an oxide, a low-k oxide or a low-k nitride and the first and second spacers 140 and 240 are nitride films, a dielectric constant of the second insulation layer 210 including the insulating material 142 is smaller than dielectric constants of the first and second spacers 140 and 240.

For example, a method of filling only the second recess 210r with the insulating material 142 while leaving the first recess 110r as an empty space will now be described. First, a photoresist film pattern is formed only on the first region I while exposing the second recess 210r of the second region II. Thereafter, the second recess 210r is filled with the insulating material 142, thereby forming the second insulation layer 210 on sidewalls of the second gate pattern 200. After forming the second insulation layer 210, the photoresist film pattern formed on the first region I is removed. Second, the first recess 110r is filled with the insulating material 142. Thereafter, a photoresist film pattern is formed on the second region II, thereby exposing only the first region I. The insulating material 142 on the exposed first region I is etched, thereby removing the insulating material 142 from the first recess 110r. After the photoresist film pattern on the second region II is removed, the blocking pattern 40 is formed on the first region I and the second region II.

Hereinafter, a method for fabricating a semiconductor device according to an exemplary embodiment of the present inventive concept will be described with reference to FIGS. 10A, 16, 17, 28, 32 and 34.

Figure 34:
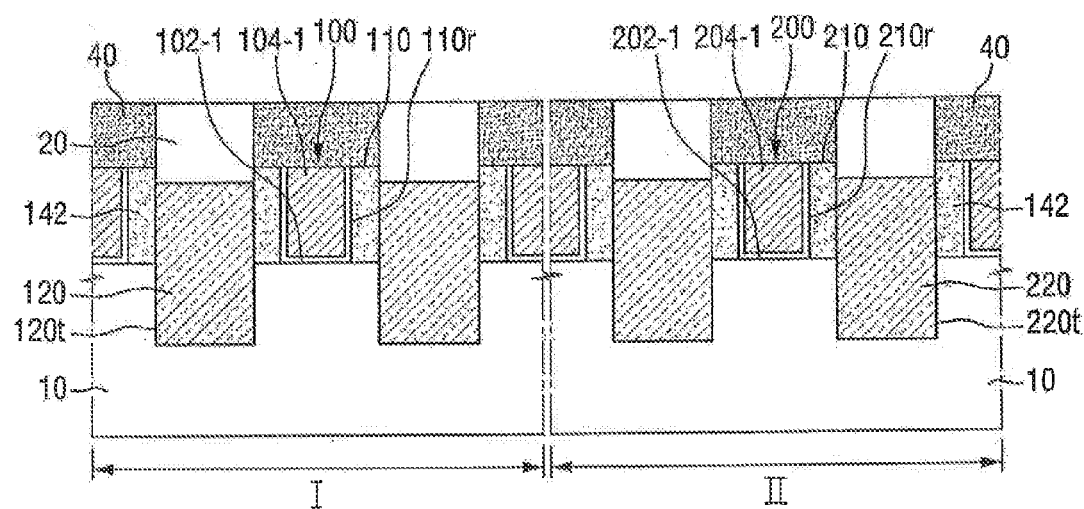
FIG. 34 is a cross-sectional view illustrating an intermediate process step of a method for fabricating a semiconductor device according to an exemplary embodiment of the present inventive concept.

FIG. 34 is a cross-sectional view illustrating an intermediate process step of a method for fabricating a semiconductor device according to an exemplary embodiment of the present inventive concept.

Referring to FIG. 34, an insulating material film may be formed on a first region I and a second region II. The insulating material film may fill a first recess 110r and a second recess 210r and may cover a first gate pattern 100 and a second gate pattern 200. A portion of the insulating material film formed on the first gate pattern 100 and the second gate pattern 200 is removed, thereby exposing the first gate pattern 100 and the second gate pattern 200. Thereafter, a blocking pattern 40 may be formed directly on the first gate pattern 100 and the second gate pattern 200.

A first insulation layer 110 having a first dielectric constant is formed on sidewalls of the first gate pattern 100, and a second insulation layer 210 having a second dielectric constant is formed on sidewalls of the second gate pattern 200. Each of the first insulation layer 110 and the second insulation layer 210 includes an insulating material 142. Therefore, a dielectric constant of the first insulation layer 110 and a dielectric constant of the second insulation layer 210 may be the same as each other.

Figure 35:
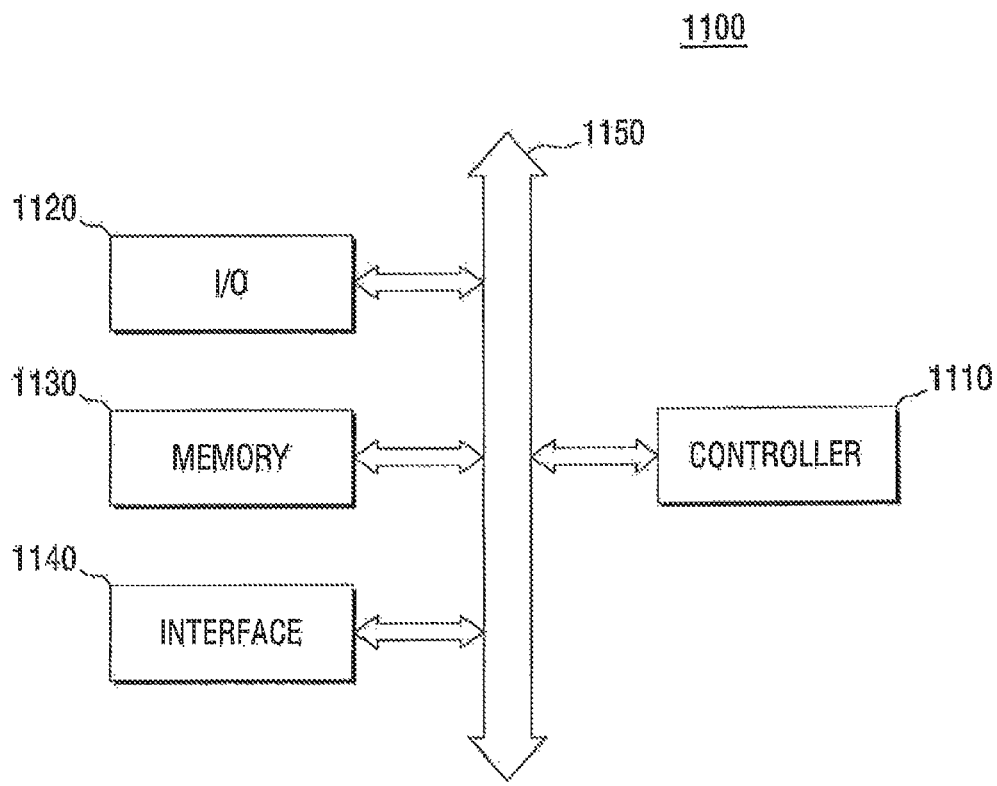
FIG. 35 is a block diagram of an electronic system incorporating a semiconductor device according to an exemplary embodiment of the present inventive concept.

FIG. 35 is a block diagram of an electronic system incorporating a semiconductor device according to an exemplary embodiment of the present inventive concept.

Referring to FIG. 35, an electronic system 1100 according to an exemplary embodiment of the present inventive concept may include a controller 1110, an input/output (I/O) device 1120, a memory device 1130, an interface 1140 and a bus 1150. The controller 1110, the I/O device 1120, the memory device 1130 and/or the interface 1140 may be connected to each other through the bus 1150. The bus 1150 may correspond to a path through which data moves.

The controller 1110 may include at least one of a microprocessor, a digital signal processor, a microcontroller, and logic devices capable of performing similar functions to those performed by these devices. The I/O device 1120 may include a keypad, a keyboard, a display device, and the like. The memory device 1130 may store data and/or instructions. The interface 1140 may transmit/receive data to/from a communication network. The interface 1140 may be wired or wireless. For example, the interface 1140 may include an antenna or a wired/wireless transceiver. Although not shown, the electronic system 1100 may be used as an operating memory for improving the operation of the controller 1110 and may further include a high-speed DRAM and/or SRAM. The semiconductor device or FET according to an exemplary embodiment of the present inventive concept may be provided within the memory device 1130 or may be provided as a component of the controller 1110 or the I/O device 1120.

The electronic system 1100 may be applied to a personal digital assistant (PDA), a portable computer, a web tablet, a wireless phone, a mobile phone, a digital music player, a memory card, or all other devices capable of transmitting and/or receiving information in wireless environments.

Figure 36:
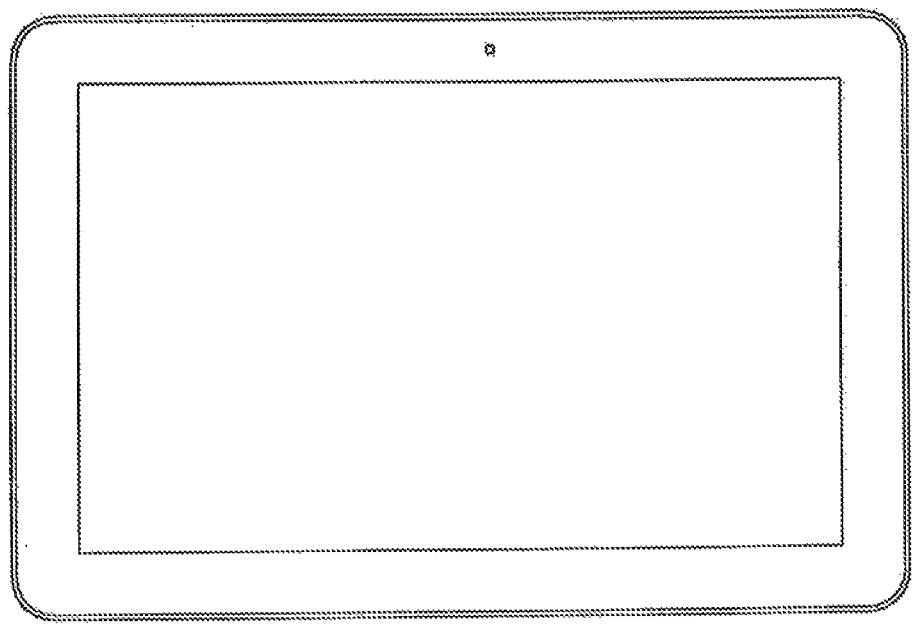
FIGS. 36 and 37 illustrate semiconductor systems to which a semiconductor device according to an exemplary embodiment of the present inventive concept can be applied.
Figure 37:
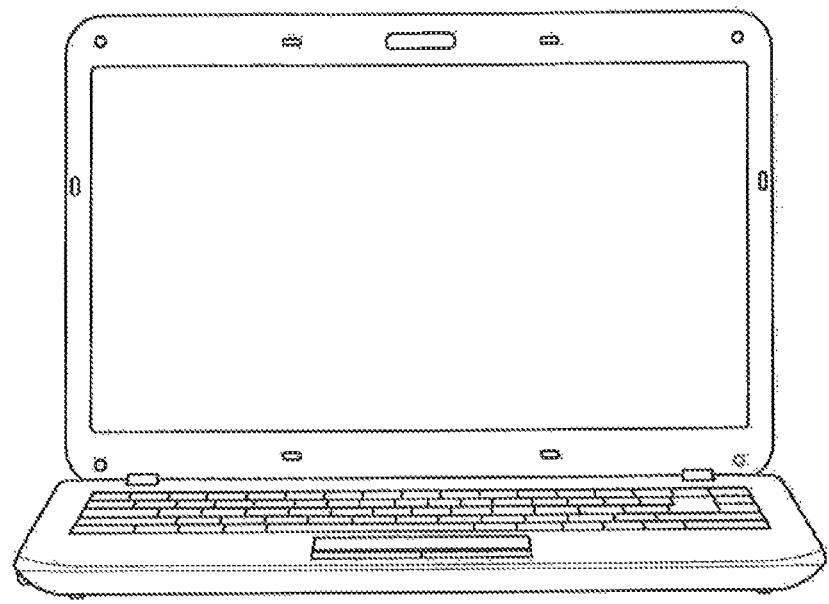

FIGS. 36 and 37 illustrate semiconductor systems to which a semiconductor device according to an exemplary embodiment of the present inventive concept can be applied. For example, FIG. 36 illustrates a tablet personal computer (PC) and FIG. 37 illustrates a notebook computer. A semiconductor device according to an exemplary embodiment of the present inventive concept may be used in a tablet PC, a notebook computer, or the like. A semiconductor device according to an exemplary embodiment of the present inventive concept can be applied to other integrated circuit devices not illustrated herein.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A semiconductor device, comprising:
a first gate pattern disposed in a peripheral region of a substrate;
a second gate pattern disposed in a cell region of the substrate;
a first insulator formed on sidewalls of the first gate pattern; and
a second insulator formed on sidewalls of the second gate pattern,
wherein a dielectric constant of the first insulator is different from a dielectric constant of the second insulator,
wherein a height of the second insulator is greater than a height of the second gate pattern
wherein the height of the second insulator is greater than a height of the first insulator, and
wherein the first gate pattern includes a first high-k gate insulation film, the first high-k gate insulation film being formed on the sidewalls and a bottom surface of the first gate pattern, and the second gate pattern includes a second high-k gate insulation film, the second high-k gate insulation film being formed on the sidewalls and a bottom surface of the second gate pattern.

2. The semiconductor device of claim 1, wherein the first insulator includes an air gap.

3. The semiconductor device of claim 1, wherein the dielectric constant of the first insulator is less than the dielectric constant of the second insulator.

4. The semiconductor device of claim 1, further comprising: a first interlayer dielectric film disposed on the second gate pattern and between the second insulator.

5. The semiconductor device of claim 4, further comprising: a second interlayer dielectric film disposed on the first gate pattern and the first insulator.

6. The semiconductor device of claim 5, wherein the first interlayer dielectric film and the second interlayer dielectric film include a same material as each other.

7. The semiconductor device of claim 5, wherein a top surface of the first interlayer dielectric film is coplanar with a top surface of the second interlayer dielectric film and the top surfaces include a same material as each other.

8. The semiconductor device of claim 5, wherein a width of the second insulator is greater than a width of the first gate pattern.

9. A semiconductor device, comprising:
a first gate pattern disposed in a first region of a substrate;
a second gate pattern disposed in a second region of the substrate;
a first insulator formed on sidewalls of the first gate pattern;
a second insulator formed on sidewalls of the second gate pattern; and
a first interlayer dielectric film disposed on the second gate pattern and between the second insulator,
wherein a dielectric constant of the first insulator is different from a dielectric constant of the second insulator,
wherein a height of the second insulator is greater than a height of the second gate pattern, and
wherein a top surface of the second insulator is coplanar with a top surface of the first interlayer dielectric film.

10. The semiconductor device of claim 9, wherein the first insulator includes an air gap.

11. The semiconductor device of claim 9, wherein the dielectric constant of the first insulator is less than the dielectric constant of the second insulator.

12. The semiconductor device of claim 9, further comprising: a second interlayer dielectric film disposed on the first gate pattern and the first insulator.

13. The semiconductor device of claim 12, wherein the first interlayer dielectric film and the second interlayer dielectric film include a same material as each other.

14. The semiconductor device of claim 12, wherein the top surface of the first interlayer dielectric film is coplanar with a top surface of the second interlayer dielectric film and the top surfaces include a same material as each other.

15. The semiconductor device of claim 9, wherein the first region is a peripheral region and the second region is a cell region.

16. A semiconductor device, comprising:
a first gate pattern disposed in a first region of a substrate;
a second gate pattern disposed in a second region of the substrate;
a first insulator formed on sidewalls of the first gate pattern; and
a second insulator formed on sidewalls of the second gate pattern,
wherein a dielectric constant of the first insulator is different from a dielectric constant of the second insulator,
wherein a height of the second insulator is greater than a height of the second gate pattern,
wherein the height of the second insulator is greater than a height of the first insulator, and
wherein the first gate pattern includes a first high-k gate insulation film, the first high-k gate insulation film being formed on the sidewalls and a bottom surface of the first gate pattern, and the second gate pattern includes a second high-k gate insulation film, the second high-k gate insulation film being formed on the sidewalls and a bottom surface of the second gate pattern.

17. The semiconductor device of claim 16, wherein the first insulator includes an air gap.

18. The semiconductor device of claim 16, wherein the dielectric constant of the first insulator is less than the dielectric constant of the second insulator.

19. The semiconductor device of claim 16, further comprising: a first interlayer dielectric film disposed on the second gate pattern and between the second insulator, and a second interlayer dielectric film disposed on the first gate pattern and the first insulator.

20. The semiconductor device of claim 16, wherein a width of the second insulator is greater than a width of the first gate pattern.

* * * * *